United States Patent
Tajima et al.

(10) Patent No.: US 8,981,524 B2
(45) Date of Patent: Mar. 17, 2015

(54) SEMICONDUCTOR DEVICE HAVING A PLURALITY OF ANTIFUSE MEMORY CELLS

(75) Inventors: Ryota Tajima, Atsugi (JP); Hajime Tokunaga, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 775 days.

(21) Appl. No.: 12/073,925

(22) Filed: Mar. 12, 2008

(65) Prior Publication Data
US 2008/0224229 A1 Sep. 18, 2008

(30) Foreign Application Priority Data
Mar. 14, 2007 (JP) ................................. 2007-064490

(51) Int. Cl.
| | |
|---|---|
| H01L 23/52 | (2006.01) |
| H01L 29/04 | (2006.01) |
| H01L 29/10 | (2006.01) |
| H01L 31/036 | (2006.01) |
| H01L 27/10 | (2006.01) |
| H01L 23/525 | (2006.01) |

(52) U.S. Cl.
CPC ............ *H01L 27/101* (2013.01); *H01L 23/5252* (2013.01)
USPC ....................... 257/530; 257/50; 257/E23.147

(58) Field of Classification Search
USPC .......................................................... 257/50
See application file for complete search history.

(56) References Cited

U.S. PATENT DOCUMENTS

| | | | |
|---|---|---|---|
| 4,348,746 A * | 9/1982 | Okabayashi et al. | .......... 365/182 |
| 4,914,055 A * | 4/1990 | Gordon et al. | ................ 438/600 |
| 5,070,384 A | 12/1991 | McCollum et al. | |
| 5,206,665 A | 4/1993 | Kawade et al. | |
| 5,210,598 A | 5/1993 | Nakazaki et al. | |

(Continued)

FOREIGN PATENT DOCUMENTS

| | | |
|---|---|---|
| EP | 0414361 A | 2/1991 |
| EP | 0603105 A | 6/1994 |

(Continued)

OTHER PUBLICATIONS

Definition of Contact, thefreedictionary.com, 2012, Retrieved from world wide web at http://www.thefreedictionary.com/p.contact on Nov. 16, 2012.*

(Continued)

*Primary Examiner* — Michael Jung
(74) *Attorney, Agent, or Firm* — Eric J. Robinson; Property Law Office, P.C.

(57) ABSTRACT

An object is to provide an antifuse with little power consumption at the time of writing. The antifuse is used for a memory element in a read-only memory device. The antifuse includes a first conductive layer, a multilayer film of two or more layers in which an amorphous silicon film and an insulating film are alternately stacked over the first conductive layer, and a second conductive layer over the multilayer film. Voltage is applied between the first and second conductive layers and resistance of the multilayer film is decreased, whereby data is written to the memory element. When an insulating film having higher resistance than amorphous silicon is formed between the first and second conductive layers, current flowing through the antifuse at the time of writing is reduced.

12 Claims, 17 Drawing Sheets

(56) References Cited

U.S. PATENT DOCUMENTS

| | | | |
|---|---|---|---|
| 5,242,851 A * | 9/1993 | Choi | 438/215 |
| 5,308,795 A | 5/1994 | Hawley et al. | |
| 5,314,840 A | 5/1994 | Schepis et al. | |
| 5,341,016 A * | 8/1994 | Prall et al. | 257/412 |
| 5,389,475 A | 2/1995 | Yanagisawa et al. | |
| 5,485,032 A | 1/1996 | Schepis et al. | |
| 5,521,423 A | 5/1996 | Shinriki et al. | |
| 5,525,830 A | 6/1996 | Chen et al. | |
| 5,541,441 A * | 7/1996 | Yeuochung et al. | 257/530 |
| 5,557,136 A * | 9/1996 | Gordon et al. | 257/530 |
| 5,565,702 A | 10/1996 | Tamura et al. | |
| 5,581,111 A | 12/1996 | Chen | |
| 5,602,053 A | 2/1997 | Zheng et al. | |
| 5,625,219 A | 4/1997 | Takagi | |
| 5,641,985 A | 6/1997 | Tamura et al. | |
| 5,670,403 A | 9/1997 | Chen | |
| 5,670,818 A | 9/1997 | Forouhi et al. | |
| 5,679,974 A | 10/1997 | Shinriki et al. | |
| 5,705,849 A | 1/1998 | Zheng et al. | |
| 5,726,484 A * | 3/1998 | Hart et al. | 257/530 |
| 5,780,919 A | 7/1998 | Chua et al. | |
| 5,798,534 A | 8/1998 | Young | |
| 5,929,505 A | 7/1999 | Takagi et al. | |
| 5,970,372 A | 10/1999 | Hart et al. | |
| 6,034,882 A | 3/2000 | Johnson et al. | |
| 6,051,851 A | 4/2000 | Ohmi et al. | |
| 6,097,077 A | 8/2000 | Gordon et al. | |
| 6,124,193 A | 9/2000 | Hawley et al. | |
| 6,150,705 A | 11/2000 | Chen | |
| 6,288,437 B1 | 9/2001 | Forbes et al. | |
| 6,320,225 B1 * | 11/2001 | Hargrove et al. | 257/347 |
| 6,429,503 B2 * | 8/2002 | Lehr et al. | 257/530 |
| 6,465,282 B1 | 10/2002 | Tobben et al. | |
| 6,525,399 B2 | 2/2003 | Cutter et al. | |
| 6,528,815 B1 | 3/2003 | Brown et al. | |
| 6,750,530 B1 | 6/2004 | Klaasen et al. | |
| 6,795,339 B2 | 9/2004 | Ooishi | |
| 6,809,952 B2 | 10/2004 | Masui | |
| 6,828,685 B2 | 12/2004 | Stasiak | |
| 6,841,846 B1 * | 1/2005 | Chen et al. | 257/530 |
| 6,844,609 B2 | 1/2005 | Motsiff et al. | |
| 6,903,958 B2 | 6/2005 | Bernds et al. | |
| 6,950,331 B2 | 9/2005 | Yang et al. | |
| 6,960,744 B2 * | 11/2005 | Adkisson et al. | 219/494 |
| 6,962,844 B2 | 11/2005 | Stasiak | |
| 6,979,880 B2 | 12/2005 | Bhattacharyya et al. | |
| 7,034,380 B2 | 4/2006 | Andideh | |
| 7,087,975 B2 | 8/2006 | Lehmann et al. | |
| 7,133,086 B2 | 11/2006 | Toyota et al. | |
| 7,145,533 B2 | 12/2006 | Imamura | |
| 7,342,615 B2 | 3/2008 | Toyota et al. | |
| 7,358,590 B2 | 4/2008 | Yukawa et al. | |
| 7,442,997 B2 | 10/2008 | Zhang | |
| 7,658,333 B2 | 2/2010 | Koyama et al. | |
| 7,687,327 B2 | 3/2010 | Cleeves et al. | |
| 7,714,408 B2 | 5/2010 | Tokunaga | |
| 7,768,014 B2 | 8/2010 | Asami | |
| 7,994,607 B2 | 8/2011 | Tokunaga et al. | |
| 2002/0000634 A1 | 1/2002 | Drescher et al. | |
| 2002/0001865 A1 | 1/2002 | Zhang | |
| 2002/0072154 A1 | 6/2002 | Hawley et al. | |
| 2003/0026157 A1 | 2/2003 | Knall et al. | |
| 2003/0026158 A1 | 2/2003 | Knall et al. | |
| 2003/0156449 A1 | 8/2003 | Ooishi | |
| 2003/0183699 A1 | 10/2003 | Masui | |
| 2003/0230746 A1 | 12/2003 | Stasiak | |
| 2004/0026690 A1 | 2/2004 | Bernds et al. | |
| 2004/0027849 A1 | 2/2004 | Yang et al. | |
| 2004/0129960 A1 | 7/2004 | Maruyama et al. | |
| 2004/0164302 A1 | 8/2004 | Arai et al. | |
| 2004/0217441 A1 | 11/2004 | Lehmann et al. | |
| 2005/0006640 A1 | 1/2005 | Jackson et al. | |
| 2005/0070060 A1 | 3/2005 | Walker et al. | |
| 2005/0121742 A1 | 6/2005 | Petti et al. | |
| 2005/0174845 A1 | 8/2005 | Koyama et al. | |
| 2006/0097250 A1 | 5/2006 | Koyama et al. | |
| 2006/0175648 A1 | 8/2006 | Asami | |
| 2006/0214254 A1 * | 9/2006 | Ishitsuka et al. | 257/499 |
| 2006/0220252 A1 | 10/2006 | Yukawa et al. | |
| 2006/0263634 A1 | 11/2006 | Yamazaki | |
| 2007/0007342 A1 | 1/2007 | Cleeves et al. | |
| 2007/0258221 A1 | 11/2007 | Koyama et al. | |
| 2008/0224140 A1 | 9/2008 | Tokunaga et al. | |
| 2010/0025769 A1 * | 2/2010 | Hook et al. | 257/369 |
| 2010/0193789 A1 | 8/2010 | Tokunaga | |
| 2010/0273302 A1 | 10/2010 | Asami | |

FOREIGN PATENT DOCUMENTS

| | | |
|---|---|---|
| EP | 0671767 A | 9/1995 |
| EP | 0680087 A | 11/1995 |
| EP | 1435653 A | 7/2004 |
| JP | 56-044198 A | 4/1981 |
| JP | 60-117660 A | 6/1985 |
| JP | 02-146745 | 6/1990 |
| JP | 03-179763 A | 8/1991 |
| JP | 04-028249 A | 1/1992 |
| JP | 04-061272 A | 2/1992 |
| JP | 04-226068 | 8/1992 |
| JP | 04-282864 | 10/1992 |
| JP | 04-373147 A | 12/1992 |
| JP | 05-343633 A | 12/1993 |
| JP | 06-260558 A | 9/1994 |
| JP | 06-295991 A | 10/1994 |
| JP | 07-045793 A | 2/1995 |
| JP | 07-297293 A | 11/1995 |
| JP | 08-078532 A | 3/1996 |
| JP | 08-153799 A | 6/1996 |
| JP | 08-316324 A | 11/1996 |
| JP | 2002-318554 A | 10/2002 |
| JP | 3501416 | 3/2004 |
| JP | 2004-214281 A | 7/2004 |
| JP | 2005-251183 A | 9/2005 |
| JP | 2006-107470 A | 4/2006 |
| JP | 2006-114875 A | 4/2006 |
| JP | 2006-237584 A | 9/2006 |
| JP | 2007-059880 A | 3/2007 |
| WO | WO-96/07300 | 3/1996 |
| WO | WO-2004/015778 | 2/2004 |
| WO | WO-2005/076359 | 8/2005 |
| WO | WO-2005/096380 | 10/2005 |
| WO | WO-2005/119779 | 12/2005 |
| WO | WO-2006/028231 | 3/2006 |

OTHER PUBLICATIONS

Cronquist.B et al., "Modifications of COTS FPGA Devices for Space Applications", pp. 1-5.

European Search Report (Application No. 08004499.3) Dated Aug. 25, 2011.

European Search Report (Application No. 08004499.3) Dated Mar. 12, 2013.

* cited by examiner

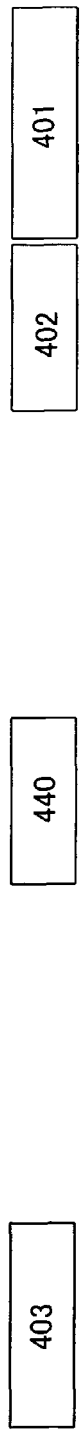
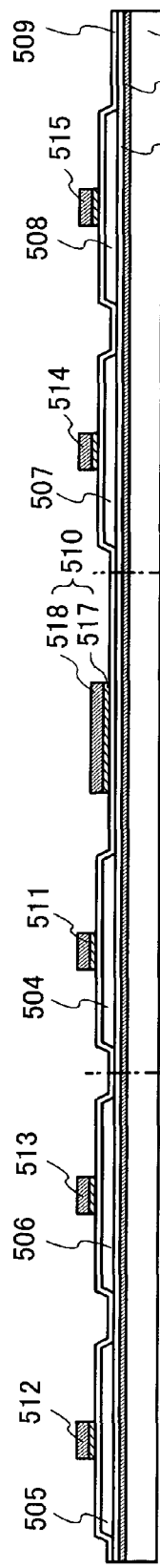
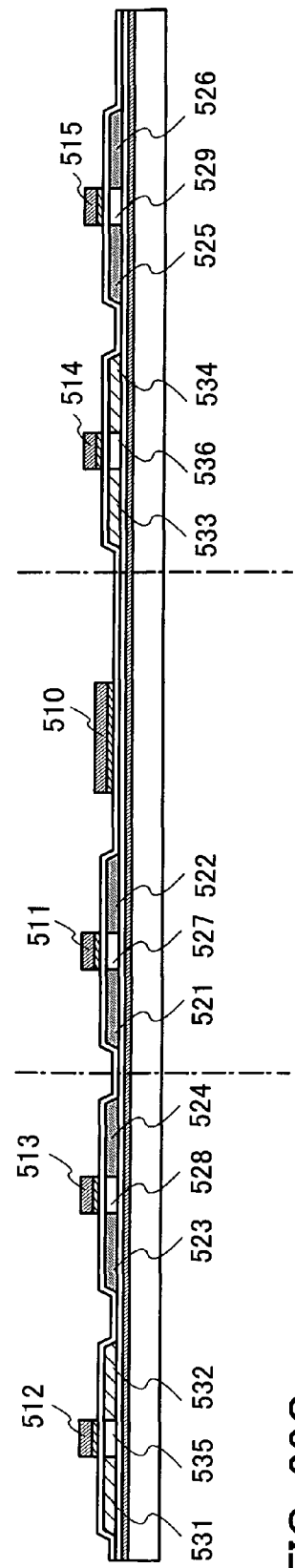
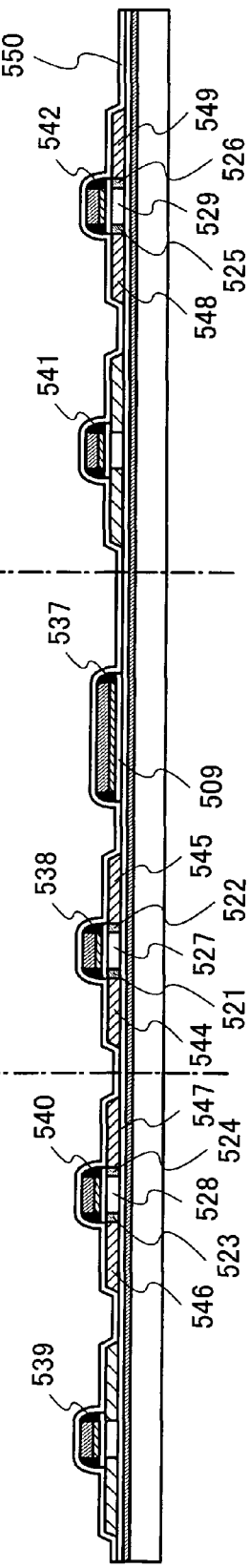
FIG. 23A
FIG. 23B
FIG. 23C

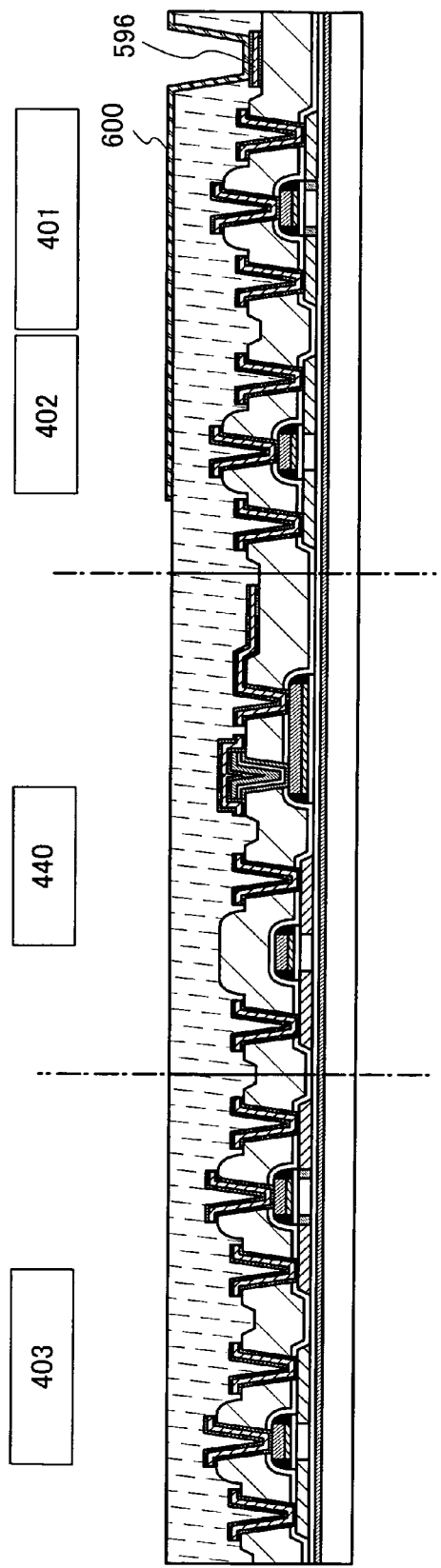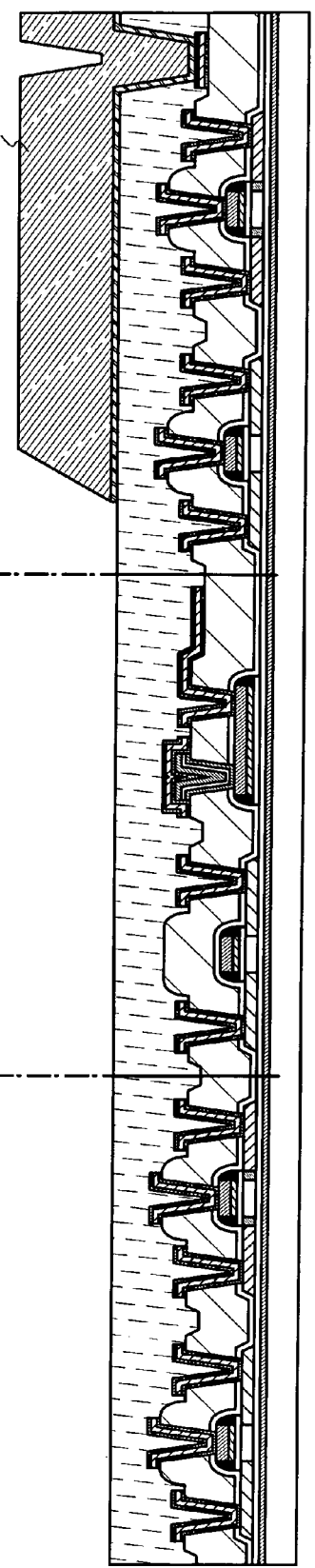

SEMICONDUCTOR DEVICE HAVING A PLURALITY OF ANTIFUSE MEMORY CELLS

BACKGROUND OF THE INVENTION

1. Field of the Invention

The present invention relates to a semiconductor device including an antifuse and a manufacturing method of the semiconductor device.

Note that a semiconductor device in this specification refers to all devices which can function by utilizing semiconductor characteristics, and electro-optical devices, semiconductor circuits, and electronic appliances are all semiconductor devices.

2. Description of the Related Art

A ROM (read only memory), which performs only reading, is classified into a mask ROM and a PROM (programmable ROM). A fuse ROM and an antifuse ROM are a kind of PROM. The mask ROM is a ROM to which information is written using a photomask in a manufacturing process. The fuse ROM is a ROM in which a fuse which is in a conductive state at the time of manufacture is used for a memory element and the fuse is disconnected by current after the manufacture to make electrodes of the fuse electrically disconnected, whereby information is stored. On the other hand, the antifuse ROM is a ROM in which an antifuse which is in a nonconductive state at the time of manufacture is used for a memory element and electrodes of the antifuse are electrically connected by current after the manufacture, whereby information is written thereto. For example, an antifuse using silicon or germanium is described in Patent Document 1 (Japanese Published Patent Application No. H7-297293), Patent Document 2 (Japanese Published Patent Application No. H6-260558), Patent Document 3 (Japanese Published Patent Application No. H5-343633), Patent Document 4 (Japanese Published Patent Application No. H4-282864), and Patent Document 5 (Japanese Published Patent Application No. H4-226068).

In Patent Document 1, an antifuse in which amorphous silicon is interposed between a pair of conductors is described. In Patent Document 1, one of electrodes is formed of a metal, and the amorphous silicon and the metal are made to react with each other to form silicide, whereby the antifuse is placed in a conductive state.

According to Patent Document 1, when a silicide reaction rate is set to greater than or equal to 10 m/sec, variation in resistance values of the antifuse which has been placed in the conductive state and malfunction of the antifuse which has been placed in the conductive state can be suppressed, and realization of the reaction rate of greater than or equal to 10 m/sec results from an effect of not exposing a surface on which the amorphous silicon and the metal are to be formed to an oxygen atmosphere like the air between a formation step of the amorphous silicon and a formation step of the metal. Therefore, in Patent Document 1, the antifuse is manufactured in such a manner that the metal film, the amorphous silicon, and the metal film are continuously formed without being exposed to the air in a multi-chamber system.

In Patent Document 2, an antifuse constituted by aluminum and germanium which is in contact with the aluminum is described.

An antifuse described in Patent Document 3 has a structure in which an amorphous silicon film containing germanium is interposed between wirings. According to Patent Document 3, writing voltage can be lowered by adjustment of content percentage of germanium in the amorphous silicon film.

In Patent Document 4, an antifuse constituted by an electrode; a conductor formed of silicon nitrides; an amorphous silicon layer over the conductor; a conductor formed of silicon nitrides, which is over the amorphous silicon; and an electrode over, the conductor is described.

In Patent Document 5, an antifuse constituted by an electrode formed of a heat-resistant metal layer and a titanium layer; a conductor layer over the electrode; an amorphous silicon layer over the conductor layer; and an electrode over the amorphous silicon layer is described.

SUMMARY OF THE INVENTION

It is an object of the present invention to reduce power consumed by writing to an antifuse using a semiconductor film.

As described above, in order to manufacture the antifuse described in Patent Document 1, it is necessary to continuously form the metal film, the amorphous silicon, and the metal film in the multi-chamber system without being exposed to air. As described above, there are restrictions on the manufacturing process and the manufacturing apparatus.

In view of the foregoing problem, it is an object of the present invention to provide an antifuse having a structure which is capable of being exposed to air at the time of manufacture of the antifuse.

The present invention relates to a semiconductor device using an antifuse for a memory element. According to one feature of the present invention, a layer between a pair of conductive layers of the antifuse is formed of a multilayer film in which a semiconductor film and a film having higher resistance than the semiconductor film are alternately stacked, whereby current flowing through the antifuse at the time of writing is reduced and power consumption is reduced. An insulating film can be used as the film having higher resistance than the semiconductor film.

Such a multilayer film makes it possible to place the antifuse in an electrically-stable state by writing operation even if the multilayer film and the conductive layer are formed after a surface on which the multilayer film and the conductive layer are to be formed is exposed to an atmosphere containing oxygen, like air or the like, in other words, after the surface is exposed to an atmosphere by which a natural oxide film is formed.

In the present invention, the multilayer film includes two or more semiconductor films or two or more insulating films. For example, as a structure of a multilayer film including two semiconductor layers, there are four structures described below, and these structures are all included in the category of the present invention.

1. A semiconductor film, an insulating film, and a semiconductor film
2. A semiconductor film, an insulating film, a semiconductor film, and an insulating film
3. An insulating film, a semiconductor film, an insulating film, and a semiconductor film
4. An insulating film, a semiconductor film, an insulating film, a semiconductor film, and an insulating film A multilayer film including three or more semiconductor films can also be formed in such a manner that a semiconductor film and an insulating film are alternately stacked as in the above-described structures 1 to 4. In addition, in the present invention, a multilayer film can have a two-layer structure including one semiconductor film and one insulating film.

The semiconductor film included in the multilayer film can be formed of a semiconductor containing silicon or germanium as its main component. For example, as the semiconductor containing silicon as its main component, there are silicon, $Si_xGe_{1-x}$ (0<x<1), and the like. As the semiconductor containing germanium as its main component, there are germanium, $Si_xGe_{1-x}$ (0<x<1), and the like. A crystalline structure of a layer which forms the semiconductor film is a non-single crystal structure such as an amorphous structure, a microcrystalline structure, or a polycrystalline structure.

The thickness of the semiconductor film included in the multilayer film can be set to greater than or equal to 5 nm and less than or equal to 200 nm. The thickness is preferably greater than or equal to 5 nm and less than or equal to 100 nm, more preferably greater than or equal to 5 nm and less than or equal to 55 nm. In the case where the multilayer film includes two or more semiconductor films, the total thickness of the semiconductor films is set to less than or equal to 200 nm. The total thickness is preferably less than or equal to 100 nm, more preferably less than or equal to 55 nm.

The insulating film included in the multilayer film can be formed of silicon, germanium, $Si_xGe_{1-x}$, or metal oxide. Alternatively, the insulating film can be formed of nitride or nitride oxide as well as oxide.

The thickness of the insulating film can be set to greater than or equal to 1 nm and less than or equal to 20 nm. The thickness is more preferably greater than or equal to 1 nm and less than or equal to 15 nm. In addition, in the case where the multilayer film includes two or more insulating films, the total thickness of the insulating films included in the multilayer film is preferably less than or equal to 20 nm, more preferably less than or equal to 15 nm.

In the present invention, each of the semiconductor film and the insulating film included in the multilayer film may have a single-layer structure or a multilayer structure including two or more layers.

The pair of conductive layers of the antifuse can be formed of a conductive material containing a metal element which reacts with the semiconductor film to form a metal compound or an alloy. As such a metal element, there are a metal element which reacts with silicon and germanium to form a metal compound and a metal element which reacts with silicon and germanium to form an alloy. As the former metal element, Ti, W, Ni, Cr, Mo, Ta, Co, Zr, V, Pd, Hf, Pt, Fe, and the like are given. As the latter metal element, Al and the like are given. The pair of conductive layers of the antifuse can be formed of a single metal of the above-described metal, a metal compound thereof, or an alloy thereof.

The present invention makes it possible to reduce current flowing through the antifuse at the time of writing, and thus power consumption at the time of the writing can be reduced.

BRIEF DESCRIPTION OF THE DRAWINGS

In the accompanying drawings:

FIGS. 23A to 23C are cross-sectional views illustrating a manufacturing method of a semiconductor device of the present invention and cross-sectional views illustrating a manufacturing method of a semiconductor device which is capable of noncontact data transmission;

FIGS. 26A and 26B are cross-sectional views illustrating steps following the step of FIG. 25B.

DETAILED DESCRIPTION OF THE INVENTION

The present invention will be hereinafter described. However, the present invention can be carried out in many different modes and it is easily understood by those skilled in the art that modes and details of the present invention can be modified in various ways without departing from the purpose and scope of the present invention. Therefore, the present invention should not be interpreted as being limited to the description of Embodiment Modes and Embodiments.

Embodiment Mode 1

In this embodiment mode, a structure of an antifuse will be described with reference to FIGS. 1A and 1B, FIGS. 2A and 2B, FIG. 3 and FIGS. 4A and 4B. In addition, a manufacturing method of the antifuse will be described.

First, a structure of an antifuse in which a layer between two conductive layers is a multilayer film including two or more semiconductor films is described.

Figure 1A:
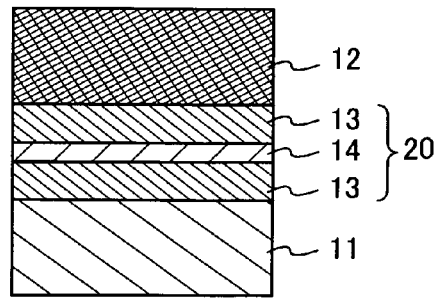
FIGS. 1A and 1B are each a cross-sectional view of an antifuse.
Figure 1B:
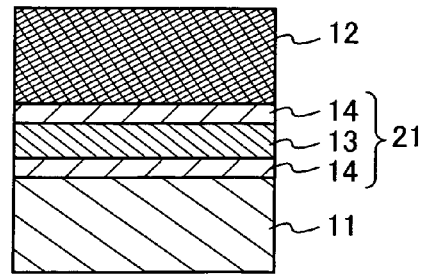

FIGS. 1A and 1B are each a cross-sectional view of an antifuse including a multilayer film having a three-layer structure. The antifuse shown in FIG. 1A includes a first conductive layer 11, a second conductive layer 12, and an intermediate layer 20 between the first conductive layer 11 and the second conductive layer 12, in which semiconductor films 13 are stacked with an insulating film 14 interposed therebetween. In addition, the antifuse shown in FIG. 1B includes an intermediate layer 21 between the first conductive layer 11 and the second conductive layer 12. In the explanation below, a layer between two conductive layers in an antifuse is referred to as an intermediate layer.

In the intermediate layer 20 of FIG. 1A, the semiconductor film 13, the insulating film 14, and the semiconductor film 13 are stacked in this order from the first conductive layer 11 side. The intermediate layer 21 of FIG. 1B has a three-layer structure in which the insulating film 14, the semiconductor film 13, and the insulating film 14 are stacked in this order from the first conductive layer 11 side.

Voltage is applied between the first conductive layer 11 and the second conductive layer 12, whereby writing to the antifuses of FIGS. 1A and 1B is performed. By application of voltage, the resistance of the intermediate layer 20 or the intermediate layer 21 is decreased, and the first conductive layer 11 and the second conductive layer 12 are made to be electrically connected to each other.

The semiconductor film 13 may be a single film formed of a semiconductor material or a multilayer film of two or more layers formed of a semiconductor material. A semiconductor containing silicon or germanium as its main component can be used as a semiconductor which forms the semiconductor film 13. As the semiconductor containing silicon as its main component, there are silicon (Si), silicon germanium ($Si_xGe_{1-x}$ (0<x<1)), silicon carbide (SiC), and the like. As the semiconductor containing germanium as its main component, there are germanium (Ge), silicon germanium ($Si_xGe_{1-x}$ (0<x<1)), and the like.

A crystalline structure of the semiconductor containing silicon or germanium as its main component, which forms the semiconductor film 13, is a non-single crystal structure, and is an amorphous structure, a microcrystalline structure, or a polycrystalline structure.

The semiconductor film 13 can be formed by a CVD method or a sputtering method. In the case where a silicon film is formed by a CVD method, silane ($SiH_4$) or disilane ($Si_2H_6$) may be used as a material gas. In the case where a germanium film is formed by a CVD method, germane ($GeH_4$) may be used as a material gas. In the case where a silicon germanium film is formed, $SiH_4$, $Si_2H_6$, or $GeH_4$ may be used as a material gas. Proportions of Si and Ge contained in silicon germanium can be controlled by change of a ratio of a material gas. In the case where a silicon film, a germanium film, or a silicon germanium film is formed by a sputtering method, a target may be changed depending on a material which is desired to be formed. For example, in the case where a silicon film is formed, a target of single crystal silicon can be used. In addition, an impurity element (e.g., P, As, or B) which serves as a donor or an acceptor may be added to the semiconductor film 13. By addition of such an impurity element, the semiconductor film 13 which has lower resistance than a film to which such an impurity element is not added. Decreasing the resistance of the semiconductor film 13 leads to an effect of reducing voltage (writing voltage) which is needed to place the antifuse in a conductive state. In the case where the semiconductor film 13 containing an element which serves as a donor or an acceptor is formed by a CVD method, for example, $PH_3$, $PF_3$, $B_2H_6$, $BF_3$, $AsH_3$, or the like is added to the above-described material gas. In the case of using a sputtering method, the semiconductor film 13 may be formed using a target containing an impurity element which serves as a donor or an acceptor. Alternatively, the semiconductor film 13 to which an impurity element is not added intentionally may be formed, and then the impurity element may be added to the semiconductor film 13.

Each semiconductor film 13 can be formed to a thickness of greater than or equal to 5 nm and less than or equal to 200 nm. The semiconductor film 13 is preferably formed to a thickness of greater than or equal to 5 nm and less than or equal to 100 nm, more preferably greater than or equal to 5 nm and less than or equal to 55 nm. In the case where two or more semiconductor films 13 are included in the intermediate layer, the total thickness of the semiconductor films 13 included in the intermediate layer is preferably less than or equal to 100 nm, more preferably less than or equal to 55 nm.

The insulating film 14 is formed as a film having higher resistance than the semiconductor film 13. The insulating film 14 may be a single-layer film formed of an insulating material or a multilayer film of two or more layers formed of an insulating material.

As an insulating material which can be used for the insulating film 14, there are, for example, oxide, nitride, and oxynitride of the above-described semiconductor containing silicon or germanium as its main component. Note that, in this specification, oxynitride refers to a material in which the amount of oxygen is the same as that of nitrogen, a material in which the amount of oxygen is higher than that of nitrogen, and a material in which the amount of nitrogen is higher than that of oxygen. Specifically, as the insulating material, there are typically silicon oxide ($SiO_x$), silicon nitride ($SiN_x$), silicon oxynitride ($SiO_xN_y$), germanium oxide ($GeO_x$), germanium nitride ($GeN_x$), germanium oxynitride ($GeO_xN_y$), silicon germanium oxide ($SiGe_xO_y$), silicon germanium nitride ($SiGe_xN_y$), silicon germanium oxynitride ($SiGe_xO_yN_z$), and the like.

These insulating materials can be formed by a CVD method, a sputtering method, an ALD (atomic layer deposition) method, or the like. Alternatively, these insulating materials can also be formed in such a manner that oxidation treatment, nitridation treatment, or oxynitridation treatment is performed to an upper surface of the semiconductor film 13. As oxidation treatment or nitridation treatment, there is a method in which oxygen radicals or nitrogen radicals are generated by plasma and the upper surface of the semiconductor film is processed by the generated radicals. Alternatively, the upper surface of the semiconductor film can be oxidized or nirtided by heat treatment in an atmosphere containing oxygen or an atmosphere containing nitrogen.

Oxynitride of a semiconductor such as silicon can be formed in such a manner that oxidation treatment is performed to the semiconductor and then nitridation treatment is performed to the semiconductor. Alternatively, nitridation treatment can be performed first. In addition, the oxynitride can be formed even by oxinitridation treatment in which oxidation and nitridation are performed at the same time, such as heat treatment in an atmosphere containing $N_2O$.

Alternatively, as the insulating material of the insulating film 14, there are metal oxide such as aluminum oxide, tantalum oxide, or hafnium oxide; metal nitride such as aluminum nitride or tungsten nitride; and metal oxynitride.

The insulating film 14 included in each of intermediate layers 21 to 26 can be formed to a thickness of greater than or equal to 1 nm and less than or equal to 20 nm. The preferable thickness of the insulating film 14 is greater than or equal to 1 nm and less than or equal to 15 nm. In the case where the intermediate layer includes two or more insulating films 14, like the intermediate layers 22 to 24, the total thickness of the insulating films 14 included in the intermediate layer is preferably less than or equal to 20 nm, more preferably less than or equal to 15 nm. This is because, although the thicker the insulating film 14 is, the lower current can flow between the first conductive layer 11 and the second conductive layer 12 at the time of writing, if the insulating film 14 is too thick, energy given to the antifuse by writing operation becomes excessive and the antifuse can be broken.

Each of the first conductive layer 11 and the second conductive layer 12 is formed of a conductive material containing a metal element which reacts with the semiconductor film 13 to generate a material having lower resistance than a semiconductor which forms the semiconductor film 13. For example, as a metal which reacts with silicon and germanium to generate a metal compound, there are tungsten (W), titanium (Ti), nickel (Ni), chromium (Cr), molybdenum (Mo), tantalum (Ta), cobalt (Co), zirconium (Zr), vanadium (V), palladium (Pd), hafnium (Hf), platinum (Pt), iron (Fe), or the like. When such a metal reacts with silicon, silicide is formed. In addition, when such a metal reacts with germanium, germanite is formed.

As the material of the first conductive layer 11 and the second conductive layer 12, a compound of such a metal or an alloy of such a metal can be used as well as such a metal. As the metal compound, there are silicide of the above-described metal such as tungsten, silicide, metal nitride such as titanium nitride, and the like. In addition, as the alloy, there are a tantalum tungsten alloy, molybdenum tungsten, and the like. These conductive materials can be formed by a sputtering method, an evaporation method, a CVD method, or the like.

Alternatively, the first conductive layer 11 and the second conductive layer 12 can be formed of a material containing, as its main component, aluminum (Al) which reacts with silicon and germanium to form an alloy. As the material containing aluminum as its main component, there are pure aluminum, aluminum containing another element such as silicon (Si) or copper (Cu), and an alloy of aluminum (e.g., aluminum tantalum or aluminum neodymium). These conductive materials containing aluminum as its main component can be formed by a sputtering method, an evaporation method, a CVD method, or the like.

Note that, since the material containing aluminum as its main component is a material in which hillocks are easily generated, the first conductive layer 11 and the second conductive layer 12 are preferably formed of a material containing a metal such as the above-described W, Ti, Ni, Cr, Mo, Ta, Co, Zr, V, Pd, Hf, Pt, or Fe as its main component, rather than the material containing aluminum as its main component. In addition, in the case where the first conductive layer 11 is formed of the material containing aluminum as its main component, it is preferable that, in the intermediate layer, a film which is in contact with the first conductive layer 11 be the insulating film 14. Similarly, in the case where the second conductive layer 12 is formed of the material containing aluminum as its main component, it is preferable that, in the intermediate layer, a layer which is in contact with the second conductive layer 12 be the insulating film 14.

The first conductive layer 11 and the second conductive layer 12 can be formed of different conductive materials. This makes more options available for the conductive material for forming the first conductive layer 11 and the second conductive layer 12; thus, flexibility of the process is increased.

In addition, as an intermediate layer including two semiconductor films 13, there are the intermediate layers 22 (see FIG. 2A) and 23 (see FIG. 2B), each of which has a four-layer structure and the intermediate layer 24 (see FIG. 3) which has a five-layer structure, as well as the intermediate layers 20 and 21, each of which has a three-layer structure.

Figure 2A:
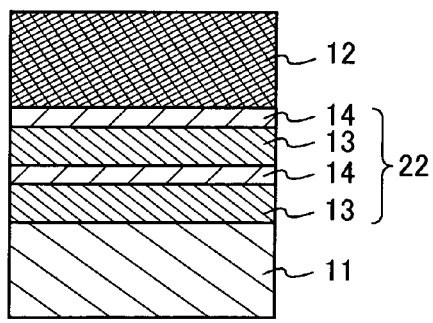
FIGS. 2A and 2B are each a cross-sectional view of an antifuse.
Figure 2B:
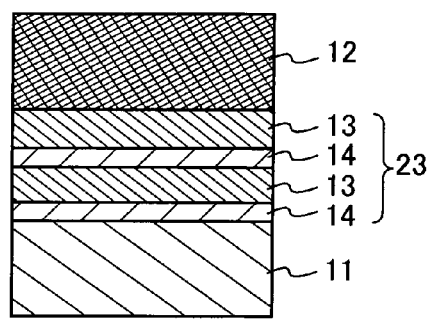
Figure 3:
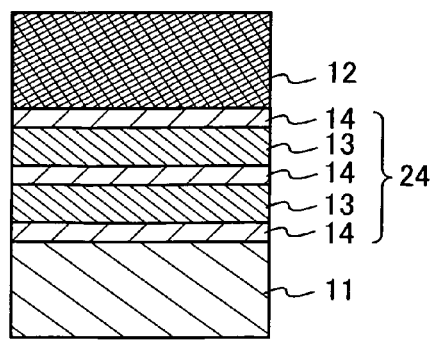
FIG. 3 is a cross-sectional view of an antifuse.

As shown in FIG. 2A, in the intermediate layer 22, the semiconductor film 13, the insulating film 14, the semiconductor film 13, and the insulating film 14 are stacked in this order from the first conductive layer 11 side. As shown in FIG. 2B, in the intermediate layer 23, the insulating film 14, the semiconductor film 13, the insulating film 14, and the semiconductor film 13 are stacked in this order from the first conductive layer 11 side. As shown in FIG. 3, in the intermediate layer 24, the insulating film 14 is further stacked over the layers which form the intermediate layer 23.

The present invention includes an antifuse in which an intermediate layer includes three or more semiconductor films 13 in its category. Similarly to the intermediate layers 21, 22, 23, and 24 respectively of FIG. 1B, FIG. 2A, FIG. 2B, and FIG. 3, the intermediate layer including three or more semiconductor films 13 can be formed in such a manner that the insulating film 14 and the semiconductor film are alternately stacked over the first conductive layer 11, and a film which is in contact with the first conductive layer 11 may be either the semiconductor film 13 or the insulating film 14.

In the present invention, the semiconductor films 13 included in the intermediate layer may be formed of the same semiconductor material or different semiconductor materials. For example, in the intermediate layer 20 of FIG. 1A, one of the semiconductor films 13 can be formed of a single film of amorphous silicon and the other insulating film 13 can be formed of a multilayer film of an amorphous silicon film and an amorphous silicon germanium film. Alternatively, both the two semiconductor films 13 may be formed of an amorphous silicon film and the thicknesses of the two semiconductor layers 13 may be different.

In the present invention, in the case where a plurality of insulating films 14 is included in the intermediate layer, the insulating films 14 may be either the same film or different films. For example, in the intermediate layer 22 of FIG. 2A, one of the insulating films 14 can be formed of a single film of a silicon oxide film and the other insulating film 14 can be formed of a multilayer film having a two-layer structure including two silicon oxynitride films, each of which has different ratios of Si, O, and N.

Next, description is made on the following: one or more insulating films 14 and two or more semiconductor films 13 are formed in the intermediate layer, whereby current flowing through the antifuse at the time of writing can be reduced. Here, the description is made using the antifuses having the structure of FIG. 1A as an example.

Figure 14:
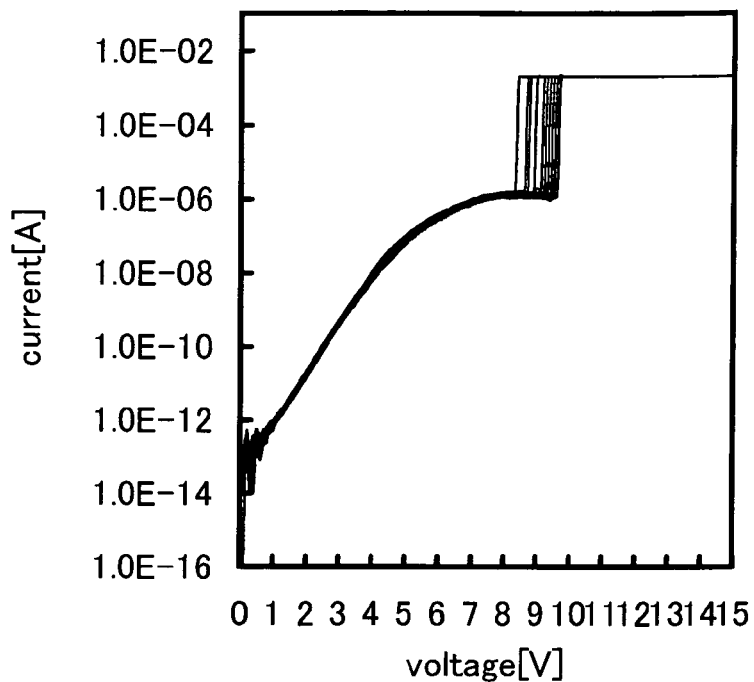
FIG. 14 is a graph showing current-voltage characteristics of an element A obtained when the element A is placed in a conductive state from a nonconductive state.

FIG. 14 is a graph showing current-voltage characteristics obtained when the antifuses having the structure shown in FIG. 1A is placed in a conductive state from a nonconductive state. A structure of an element (hereinafter, referred to as an element A), characteristics of which shown in FIG. 14 were measured is as follows: the first conductive layer 11 is formed of 370-nm-thick tungsten and the second conductive layer 12 is formed of 250-nm-thick titanium. Each of the two semiconductor films 13 included in the intermediate layer 20 is formed of 25-nm-thick amorphous silicon, and the insulating film 14 is formed of 6-nm-thick silicon oxynitride.

Figure 17:
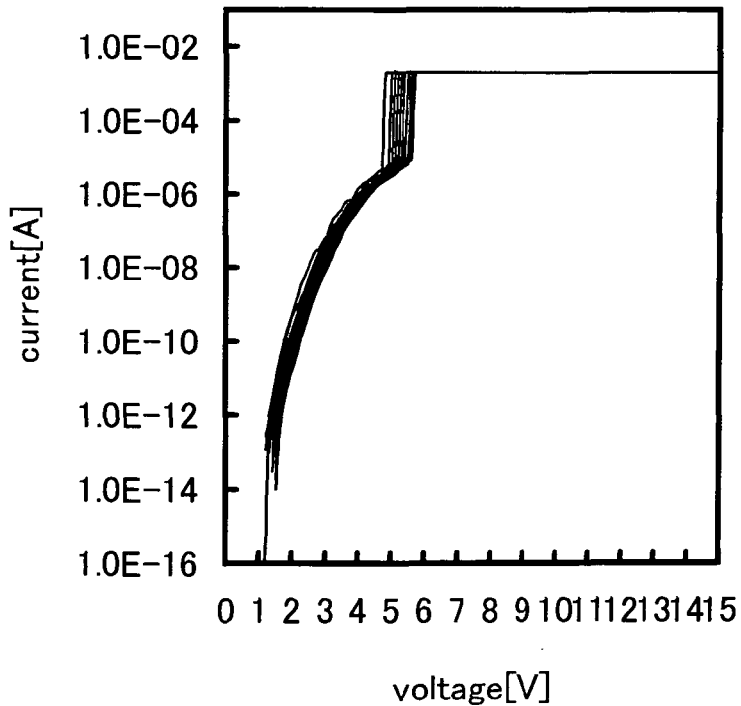
FIG. 17 is a graph showing current-voltage characteristics of a reference element obtained when the reference element is placed in a conductive state from a nonconductive state.

FIG. 17 is a graph showing current-voltage characteristics of an antifuse having a structure which is similar to that of Patent Document 1, as a comparative example. A structure of an element (hereinafter, referred to as a reference element), characteristics of which shown in FIG. 17 were measured is as follows: an intermediate layer is formed of 50-nm-thick amorphous silicon, and the structures of the first conductive layer 11 and the second conductive layer 12 are the same as those of the element A. That is, as for both the element A and the reference element, the total thickness of the amorphous silicon films included in the intermediate layer is 50 nm. In addition, the size of both the element A and the reference element is 2 μm×2 μm. Note that the manufacturing methods and structures of the element A and the reference element are described in more detail in Embodiment 1.

FIG. 14 shows that the value of the current flowing through the element A right before the element A is placed in the conductive state is about 1 μA. On the other hand, the value of the current flowing through the reference element right before the reference element is in a conductive state is about 10 μA (see FIG. 17). That is, the value of the current flowing through the element A right before the element A is placed in the conductive state is decreased to about $\frac{1}{10}$ of the value of the current flowing through the reference element right before the reference element is placed in the conductive state.

Figure 18:
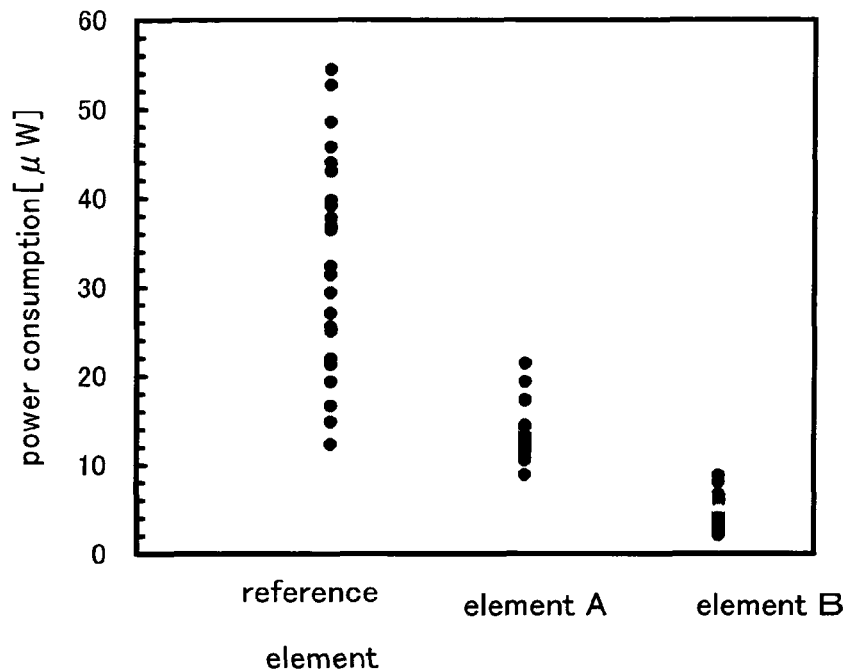
FIG. 18 is a graph showing power consumed at the time of writing to the element A, the element B, and the reference element.

FIG. 18 shows power consumption at the time of writing to the element A and the reference element. FIG. 18 shows data obtained by the measurement of given 42 elements over the same substrate. The power consumption was calculated by multiplication of the value of the voltage (writing voltage) applied to the antifuse when the antifuse was placed in the conductive state and the value of the current (consumption current) flowing at that time. According to FIG. 18, the maximum power consumption of the element A is less than or equal to half of that of the reference element, and the average power consumption of the element A is less than that of the reference element. In addition, variation in power consumption among the elements A is less than that among the reference elements. Thus, using the element A as a memory element makes it possible to reduce power consumption at the time of writing to a semiconductor device including a plurality of memory elements such as a PROM (programmable read only memory) and a PLA (programmable logic array).

Figure 19:
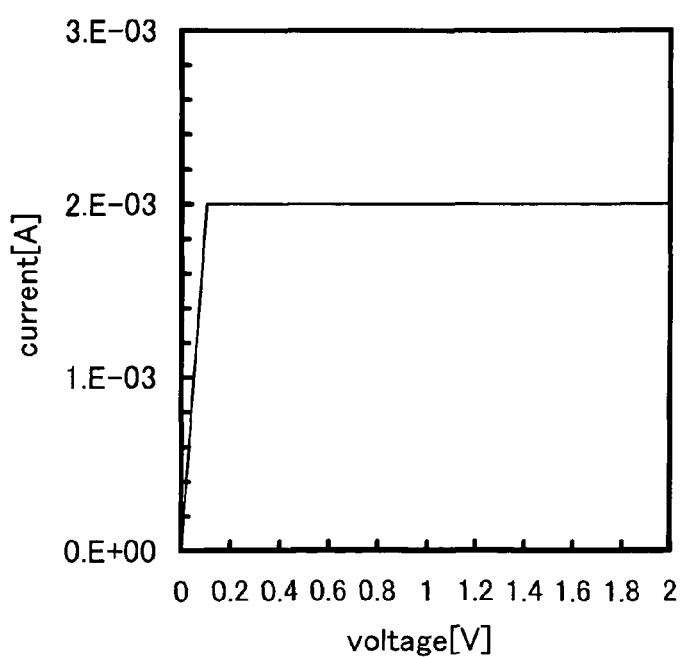
FIG. 19 is a graph showing current-voltage characteristics of the element A obtained after the element A was placed in the conductive state.
Figure 21:
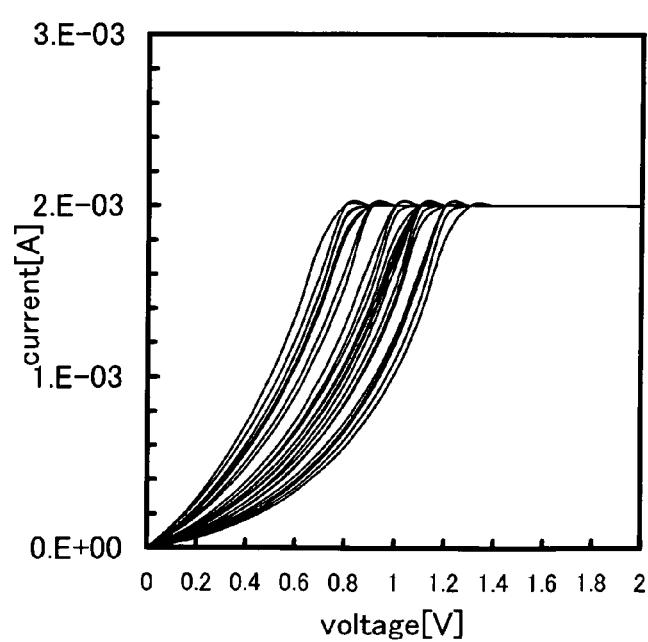
FIG. 21 is a graph showing current-voltage characteristics of the reference element obtained after the reference element was placed in the conductive state.

FIG. 19 is a graph showing current-voltage characteristics of the element A after writing operation. FIG. 21 is a graph showing current-voltage characteristics of the reference element after writing operation. FIG. 19 shows that the resistance values of 25 elements A after the writing operation are nearly uniform and the resistance values are reduced to less than or equal to 50Ω. This shows that the resistance of the plural elements A is uniformly reduced by the writing operation and electrical connection between a first conductive layer and a second conductive layer of each of the elements A is stable. That is, the plural elements A are placed in a uniform and stable conductive state by the writing operation. In FIG. 21, on the other hand, the resistance values of plural reference elements after the writing operation vary and even the minimum resistance value is about 300Ω. That is, FIG. 21 shows that the resistance of the reference element is not sufficiently reduced by the writing operation and electrical connection (a conductive state) between a first conductive layer and a second conductive layer is unstable. Thus, using the element A as a memory element makes it possible to suppress generation of data reading errors in a semiconductor device including a plurality of memory elements such as a PROM and a PLA and to perform data writing more surely.

Thus, two or more semiconductor films and an insulating film having higher resistance than the semiconductor film are alternately provided in an intermediate layer of an antifuse, whereby current flowing through the antifuse right before the antifuse is placed in a conductive state can be reduced. As a result, power consumed when data is written to a plurality of memory cells each including the antifuse of the present invention can be reduced. In addition, a multilayer structure in which an insulating film and a semiconductor film are alternately arranged and two or more insulating films are provided is employed, whereby similarly to the antifuse including two or more semiconductor films, current flowing through the antifuse right before the antifuse is placed in a conductive state can be reduced.

In addition, an intermediate layer includes two or more semiconductor films, whereby resistance of a plurality of antifuses is reduced so as to be approximately the same and the plurality of antifuses can be placed in an electrically-stable conductive state. Moreover, a multilayer structure in which an insulating film and a semiconductor film are alternately arranged and two or more insulating films are provided is employed, whereby, similarly to the antifuse including two or more semiconductor films, the antifuse can be placed in a stable conductive state by writing operation. Thus, generation of defects of data writing in a plurality of memory cells each including the antifuse of the present invention can be reduced, and generation of data reading errors can be reduced. Thus, the present invention makes it possible to provide a semiconductor device with high reliability in data writing operation and data reading operation.

Note that, as described later in Embodiment 1, a surface of the tungsten film, which is a first conductive layer of the element A, is exposed to air at the time of manufacture of the element A. Therefore, a natural oxide film is formed on the surface; however, the amorphous silicon film, which is the first layer of the intermediate layer, is formed without performing treatment for removing the natural oxide film. In addition, a surface of the amorphous silicon film, which is the third layer of the intermediate layer, is also exposed to air. Therefore, a natural oxide film is formed on the surface; however, the titanium layer, which is the second conductive layer, is formed without performing treatment for removing the natural oxide film. Electrical characteristics shown in FIG. 14 and the like result from such exposure of the surfaces on which the intermediate layer and the second conductive layer are to be formed to an atmosphere containing oxygen, like air.

Therefore, the intermediate layer has a multilayer structure in which an insulating film and a semiconductor film are alternately stacked and two or more semiconductor films or two or more insulating films are included, whereby the first conductive layer and the intermediate layer are allowed to be exposed to air. This makes a manufacturing process of the antifuse flexible. For example, the intermediate layer can be formed after a film which forms the first conductive layer is formed and etched into a predetermined shape. In addition, the second conductive layer can be formed after a multilayer film which forms the intermediate layer is formed and etched into a predetermined shape. Moreover, a manufacturing apparatus, as described in Patent Document 1, which is peculiar to manufacture of an antifuse, is not necessarily essential.

In addition, in Patent Document 1, a metal film, an amorphous silicon film, and a metal film are formed without being exposed to air in order to place the antifuse in an electrically-stable conductive state by writing operation. In the present invention, on the other hand, the intermediate layer has a multilayer structure in which an insulating film and a semiconductor film are alternately arranged and two or more semiconductor films are included, whereby the antifuse can be placed in an electrically-stable state by writing operation even if the first conductive layer and the intermediate layer are exposed to air.

In addition, the intermediate layer has a two-layer structure including a semiconductor film and an insulating film, whereby similarly to the antifuse including two or more semiconductor films, the current flowing through the antifuse right before the antifuse is placed in a conductive state can be reduced.

Figure 4A:
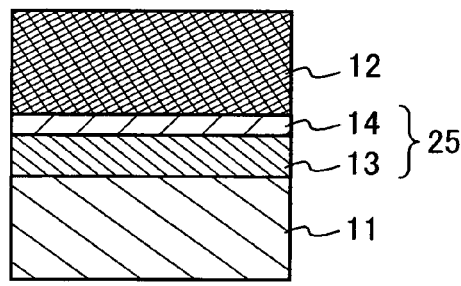
FIGS. 4A and 4B are each a cross-sectional view of an antifuse.
Figure 4B:
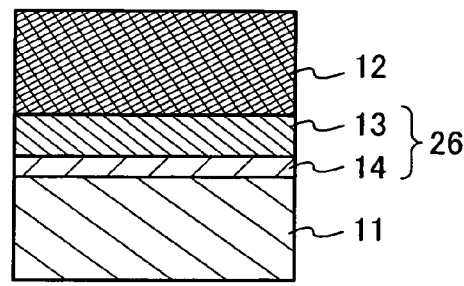

Each of FIGS. 4A and 4B is a cross-sectional view of an antifuse including an intermediate layer having a two-layer structure. The antifuse shown in FIG. 4A includes the first conductive layer 11, the second conductive layer 12, and the intermediate layer 25 between the first conductive layer 11 and the second conductive layer 12. In the intermediate layer 25, the semiconductor film 13 and the insulating film 14 are stacked in this order from the first conductive layer 11 side. The antifuse shown in FIG. 4B has a stacking order of the intermediate layer 26 which is opposite to the stacking order of the intermediate layer 25 of the antifuse shown in FIG. 4A. In the intermediate layer 26, the insulating film 14 and the semiconductor film 13 are stacked in this order from the first conductive layer 11 side.

The intermediate layer having the two-layer structure, which is shown in each of FIGS. 4A and 4B, is used for the antifuse, whereby similarly to the intermediate layer having a multilayer structure including three or more layers, the current flowing through the antifuse right before the antifuse is placed in a conductive state can be reduced. Thus, power consumed when data is written to a plurality of memory cells each including the antifuse of the present invention can be reduced.

Figure 15:
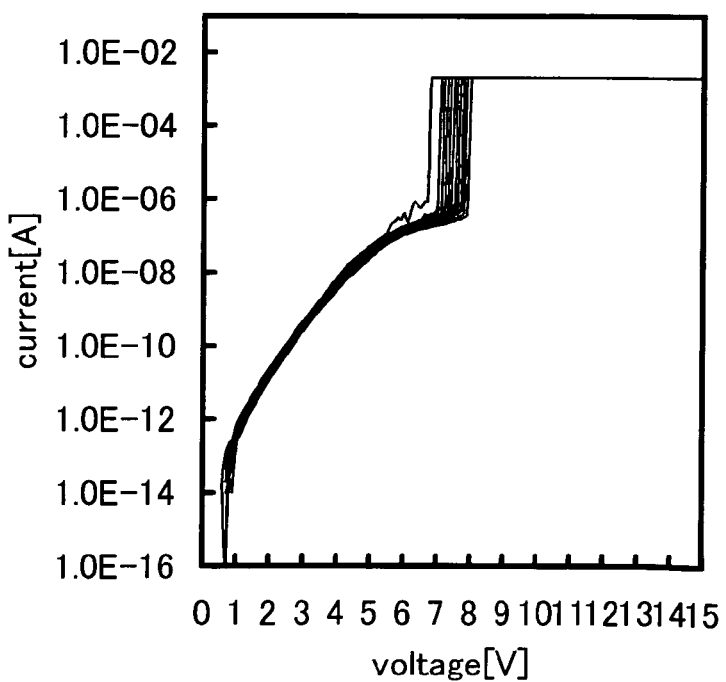
FIG. 15 is a graph showing current-voltage characteristics of an element B obtained when the element B is placed in a conductive state from a nonconductive state.
Figure 16:
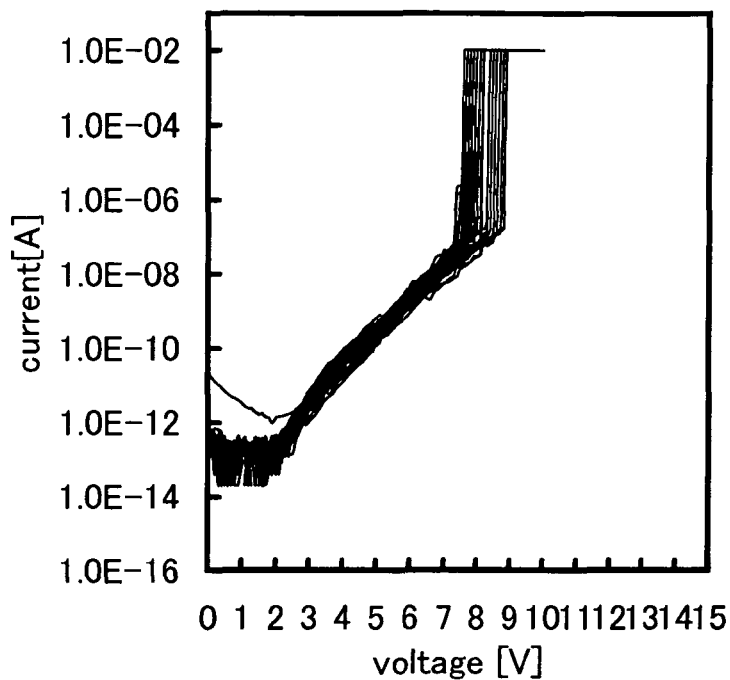
FIG. 16 is a graph showing current-voltage characteristics of an element C obtained when the element C is placed in a conductive state from a nonconductive state.

FIG. 15 is a graph showing current-voltage characteristics obtained when the antifuse having the structure shown in FIG. 4A is placed in a conductive state from a nonconductive state. FIG. 16 is a graph showing current-voltage characteristics obtained when the antifuse having the structure shown in FIG. 4B is placed in a conductive state from a nonconductive state. An element (hereinafter, referred to as an element B), characteristics of which shown in FIG. 15 were measured and an element (hereinafter, referred to as an element C), characteristics of which shown in FIG. 16 were measured have the following structure: a first conductive layer 11 is formed of 370-nm-thick tungsten, a semiconductor film 13 is formed of 50-nm-thick amorphous silicon, and an insulating film 14 is formed of 6-nm-thick silicon oxynitride. The sizes of the element B and the element C are 2 μm×2 μm, which is the same as those of the element A and the reference element. Note that manufacturing methods of the element B and the element C are described in detail in Embodiment 1.

FIG. 15 shows that the current flowing through the element B right before the element B is placed in the conductive state is about 1 μA, and FIG. 16 shows that the current flowing through the element C right before the element C is in a conductive state is about 1 μA. On the other hand, FIG. 17 shows that the current flowing through the reference element right before the reference element is placed in the conductive state is about 10 μA. That is, the current flowing through each of the element B and the element C right before each of the element B and the element C is placed in the conductive state is reduced to $\frac{1}{10}$ of the current of the reference element. Note that each of FIG. 15 and FIG. 16 shows data obtained by the measurement of given 25 elements over the same substrate.

Figure 20:
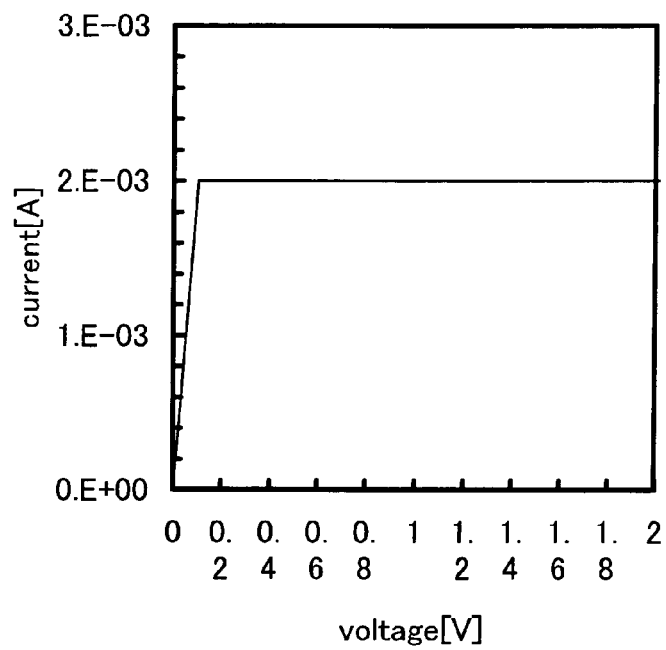
FIG. 20 is a graph showing current-voltage characteristics of the element B obtained after the element B was placed in the conductive state.

FIG. 20 is a graph showing current-voltage characteristics of the element B after the element B was placed in the conductive state. FIG. 20 shows data obtained by the measurement of given 25 elements over the same substrate. FIG. 20 shows that the resistance values of 25 elements B after writing operation are nearly uniform and the resistance values are reduced to less than or equal to 50Ω. This shows that the resistance of the plural elements B is uniformly reduced by the writing operation and electrical connection between the first conductive layer 11 and the second conductive layer 12 of each of the elements B is stable. That is, the plural elements B are placed in a uniform and stable conductive state by the writing operation. Thus, using the element B as a memory element makes it possible to suppress generation of data reading errors in a semiconductor device including a plurality of memory elements such as a PROM and a PLA and to perform data writing more surely.

FIG. 18 shows power consumption at the time of writing to the element B and the reference element. FIG. 18 shows that the maximum power consumption of the element B is less than or equal to ¼ of that of the reference element, and the average power consumption of the element B is less than that of the reference element. In addition, variation in power consumption among the elements B is less than that among the reference elements.

Therefore, when the antifuse of the present invention including the intermediate layer having the two-layer structure is used for a memory element, it is possible to reduce power consumption at the time of writing to a semiconductor device including a plurality of memory elements such as a PROM and a PLA.

In addition, the antifuse of the present invention including the intermediate layer having the two-layer structure is placed in an electrically-stable conductive state by writing operation. Therefore, the present invention makes it possible to reduce generation of defects of data writing to a plurality of memory cells each including the antifuse, and furthermore to suppress generation of data reading errors. Thus, the present invention makes it possible to provide a semiconductor device with high reliability in data writing operation and data reading operation.

Note that the element B and the element C are also formed in a similar manner to the element A: a tungsten film which is the first conductive layer is formed, an upper surface of the tungsten film is exposed to air, the intermediate layer is formed, the upper surface of the intermediate layer is exposed to air, and then a titanium film which is the second conductive layer is formed. The electrical characteristics shown in FIG. 15 and FIG. 16 are the characteristics of the element B and the element C, respectively, which are formed in such a manner that surfaces on which the intermediate layer and the second conductive layer are to be formed are exposed to an atmosphere containing oxygen.

Thus, the intermediate layer has the two-layer structure including the semiconductor film and the insulating film, whereby the first conductive layer and the intermediate layer are allowed to be exposed to the air in the manufacturing process of the antifuse. This makes the manufacturing process of the antifuse flexible. In addition, the manufacturing apparatus, as described in Patent Document 1, which is peculiar to the manufacture of the antifuse, is not necessarily essential. Moreover, even if the first conductive layer and the intermediate layer are exposed to the air, the antifuse can be placed in an electrically-stable conductive state.

Embodiment Mode 2

In this embodiment mode, a structure of a semiconductor device which includes a memory portion including a plurality of memory cells each including a memory element and a plurality of memory cells each including an antifuse, and a driver circuit which includes a transistor and is connected to the memory portion, and a manufacturing method of the semiconductor device will be described. The semiconductor device in this embodiment mode functions as a memory device and can be used as a PROM or a PLA.

Figure 5:
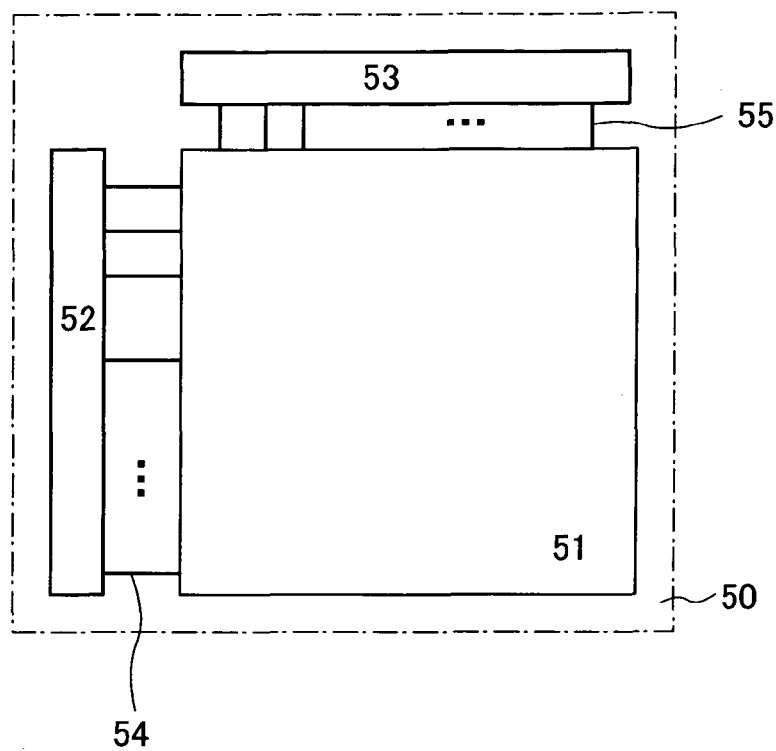
FIG. 5 is a block diagram illustrating a structural example of a semiconductor device.

FIG. 5 is a block diagram showing a structural example of the semiconductor device of this embodiment mode. A semiconductor device 50 includes a memory portion 51 including a plurality of memory cells, and a word line driver circuit 52 and a bit line driver circuit 53 which are electrically connected to the memory portion 51. Each of the word line driver circuit 52 and the bit line driver circuit 53 includes a plurality of transistors.

The memory portion 51 includes a plurality of word lines 54, and the word line driver circuit 52 is connected to the plurality of word lines 54. The word line driver circuit 52 includes a selector circuit and the like.

In addition, the memory portion 51 includes a plurality of bit lines 55, and the bit line driver circuit 53 is connected to the plurality of bit lines 55. The bit line driver circuit 53 includes a selector circuit, a reading circuit, a writing circuit, and the like. The selector circuit selects the bit line 55 to which the memory cell to which data is written and from which data is read is connected. The selected bit line 55 is connected to a writing circuit at the time of writing operation and connected to a reading circuit at the time of reading operation.

A voltage value applied to the plurality of word lines 54 is controlled by the word line driver circuit 52 and a voltage value applied to the plurality of bit lines 55 is controlled by the bit line driver circuit 53, whereby data is written to the memory cell in the memory portion 51 and the data of the memory cell is read out. That is, the word line driver circuit 52 and the bit line driver circuit 53 operate with each other, whereby data is written to the memory portion 51 and the data is read out from the memory portion 51.

Note that the structure of the semiconductor device 50 shown in FIG. 5 is an example, and the semiconductor device 50 may includes other circuits such as a sense amplifier and a buffer as well as the memory portion 51, the word line driver circuit 52, and the bit line driver circuit 53.

Figure 6:
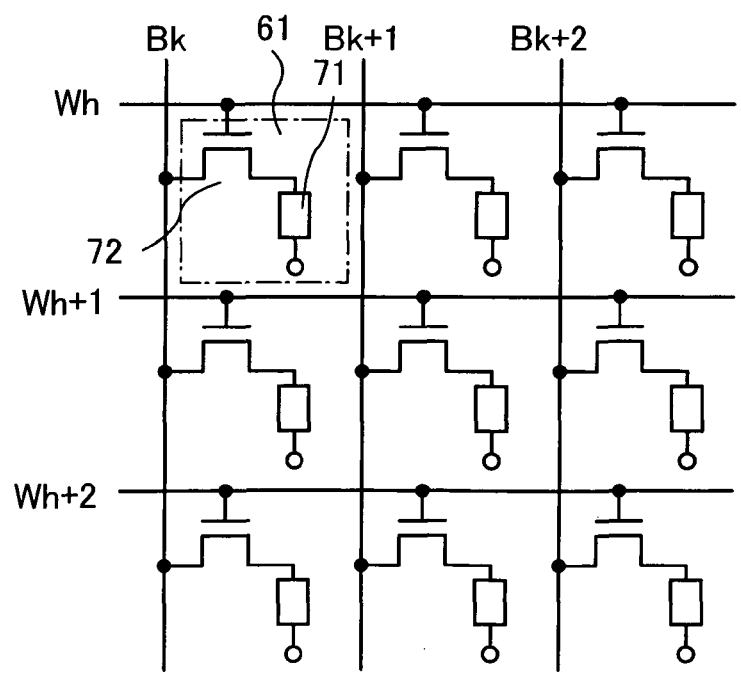
FIG. 6 is a circuit diagram illustrating a structural example of a memory portion of FIG. 5.
Figure 7:
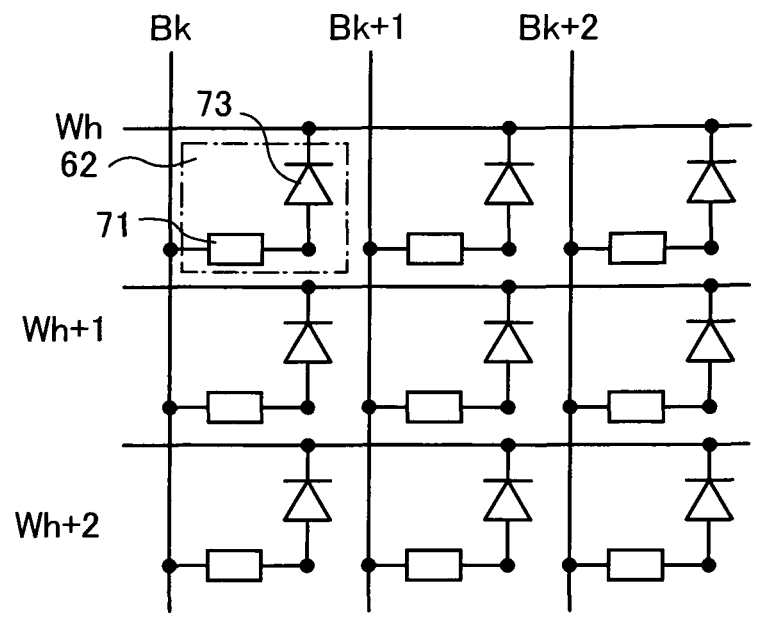
FIG. 7 is a circuit diagram illustrating a structural example of a memory portion of FIG. 5.
Figure 8:
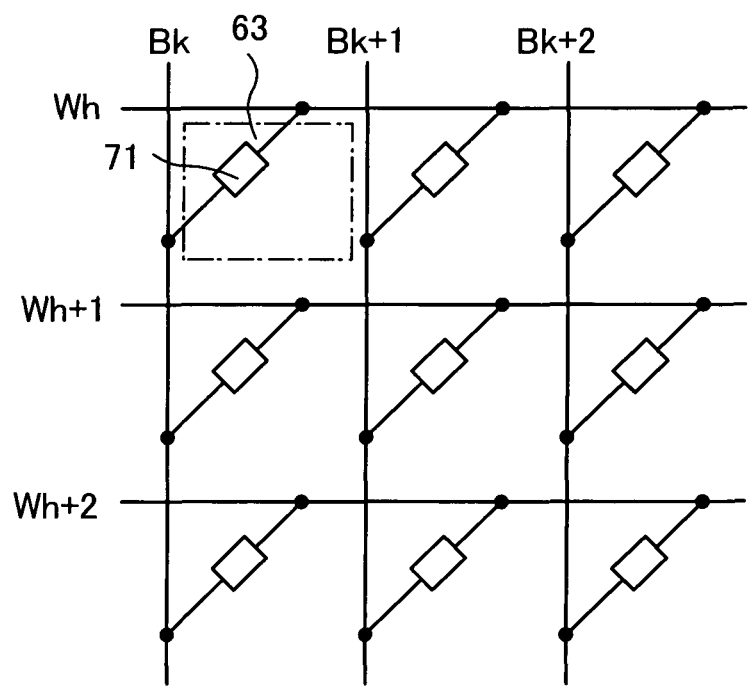
FIG. 8 is a circuit diagram illustrating a structural example of a memory portion of FIG. 5.

Next, an example of a circuit configuration of the memory portion 51 is described with reference to FIG. 6, FIG. 7, and FIG. 8. FIG. 6 and FIG. 7 are each a circuit diagram of a memory portion including active memory cells, and FIG. 8 is a circuit diagram of a memory portion including passive (simple matrix) memory cells. For convenience of illustration, in each of FIG. 6, FIG. 7, and FIG. 8, the memory portion 51 including nine memory cells which are arranged in 3 rows and 3 columns is shown. In all FIG. 6, FIG. 7, and FIG. 8, in the memory portion, three bit lines Bk, Bk+1, and Bk+2 are provided corresponding to three word lines Wh, Wh+1, and Wh+2 and intersecting with the word lines Wh, Wh+1, and Wh+2.

In the case of the active matrix memory cell shown in FIG. 6, each memory cell 61 includes an antifuse 71 as a memory element and a transistor 72 as a switching element. The transistor 72 may be either an n-type transistor or a p-type transistor.

For example, in a memory cell specified by the word line Wh and the bit line Bk, a gate of the transistor 72 is connected to the word line Wh, one of a source and a drain is connected to the bit line Bk, and the other is connected to the antifuse 71.

In the case of the active matrix memory cell shown in FIG. 7, each memory cell 62 includes the antifuse 71 as a memory element and a diode 73 as a switching element. The antifuse 71 and the diode 73 are connected in series. As the diode 73, a Schottky barrier diode, a PN junction diode, a diode-connected transistor, or the like can also be used.

In the memory cell 62 specified by the word line Wh and the bit line Bk, one of electrodes of the antifuse 71 is connected to the bit line Bk, and one of electrodes of the diode 73 is connected to the word line Wh. Note that a circuit shown in FIG. 7 is an example of the case of using a diode as a switching element. In addition, contrary to FIG. 7, the diode 73 can be connected to the word line so that current flows through the diode 73 from the word line. Alternatively, the bit line and the word line of FIG. 7 may be switched, whereby the antifuse 71 can be connected to the word line and the diode 73 can be connected to the bit line.

In the case of the passive memory cell shown in FIG. 8, each memory cell 63 includes the antifuse 71 as a memory element. In the memory cell 63 specified by the word line Wh and the bit line Bk, one of electrodes of the antifuse 71 is connected to the word line Wh, and the other is connected to the bit line Bk.

Figure 9:
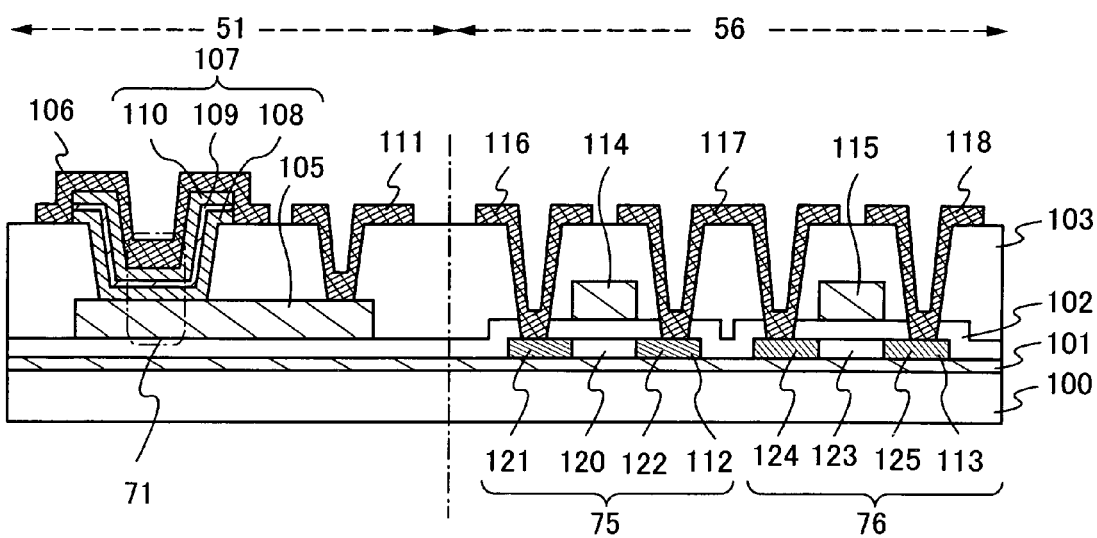
FIG. 9 is a cross-sectional view illustrating a structural example of the semiconductor device of FIG. 5.

FIG. 9 is a cross-sectional view showing a structure of the semiconductor device 50. As an example, FIG. 9 is a cross-sectional view of the semiconductor device 50 in which a thin film transistor (TFT) is used as a transistor which constitutes a part of a circuit. The antifuse 71 is shown as a typical example of a cross section of the memory portion 51. In addition, as a cross section of the word line driver circuit 52 and the bit line driver circuit 53 (in FIG. 9, these two circuits are collectively referred to as a driver circuit portion 56), a CMOS circuit constituted by an n-channel TFT 75 and a p-channel TFT 76 is shown.

As shown in FIG. 9, the antifuse 71, the n-channel TFT 75, and the p-channel TFT 76 are formed over a substrate 100 with an insulating film 101 interposed therebetween.

As the substrate 100, the following can be used, for example: a glass substrate, a quartz substrate, a sapphire substrate, a substrate made of an insulating material, such as a plastic substrate, or a conductive substrate such as a stainless steel substrate.

The antifuse 71 includes a first electrode 105, a second electrode 106, and an intermediate layer 107 between the first electrode 105 and the second electrode 106. In FIG. 9, the intermediate layer 107 has a three-layer structure in which a semiconductor film 108, an insulating film 109, and a semiconductor film 110 are stacked in this order.

The intermediate layer 107 is provided separately for each memory cell. Thus, an opening is formed in an insulating film 103 for each memory cell. The insulating film and the semiconductor films included in the intermediate layer 107 are all formed over the insulating film 103. In addition, in the opening formed in the insulating film 103, the intermediate layer 107 is formed to be in contact with the first electrode 105. The insulating film 103 is formed as a partition wall for separating the intermediate layers 107 for each cell. In addition, the insulating film 103 functions as an interlayer insulating film in the driver circuit portion 56. The second electrode 106 is formed over the insulating film 103 and in contact with an upper surface of the intermediate layer 107. In this embodiment mode, since the second electrode 106 is formed so as to cover the intermediate layer 107, the second electrode 106 is also in contact with edge surfaces (side surfaces) of the intermediate layer 107.

In addition, the first electrode 105 of the antifuse 71 is connected to a third electrode 111 formed over the insulating film 103. For example, in the case of the active matrix memory cells shown in FIG. 6 or FIG. 7, the third electrode 111 can be formed as an electrode for electrically connecting the transistor which is the switching element to the first electrode 105.

In addition, in the case of the passive memory cell shown in FIG. 8, one of the first electrode 105 and the second electrode 106 is formed as a bit line and the other is formed as a word line. For that purpose, the first electrodes 105 and the second electrodes 106 are arranged in stripes. The first electrode 105 and the second electrode 106 are arranged so as to intersect with each other. In this case, the third electrode 111 does not have to be provided in each memory cell, and at least one third electrode 111 is formed for one first electrode 105 (one word line or one bit line), whereby the third electrode can serve as an extraction electrode.

The third electrode 111 is formed of a conductive material having lower resistivity than the first electrode 105 and the third electrode 111 is formed so as to serve as a lead wiring, whereby power consumption can be reduced more in this case than in the case where the first electrode 105 is formed so as to serve as a lead wiring.

The n-channel TFT 75 includes a semiconductor film 112, a gate insulating film formed of an insulating film 102, a gate electrode 114 over the insulating film 102, and electrodes 116 and 117, one of which functions as a source electrode and the other as a drain electrode. The semiconductor film 112 includes a channel formation region 120 and n-type high concentration impurity regions 121 and 122, one of which functions as a source region and the other as a drain region.

The p-channel TFT 76 includes a semiconductor film 113, a gate insulating film formed of the insulating film 102, a gate electrode 115 over the insulating film 102, and electrodes 117 and 118, one of which functions as a source electrode and the other as a drain electrode. The semiconductor film 113 includes a channel formation region 123, and a p-type high concentration impurity regions 124 and 125, one of which functions as a source region and the other as a drain region. In FIG. 9, the n-channel TFT 75 and the p-channel TFT 76 are connected to each other by the electrode 117, whereby a CMOS circuit is formed.

Next, a manufacturing method of the semiconductor device 50 having the cross-sectional structure shown in FIG. 9 is described. In this embodiment mode, a method of forming the antifuse 71 in steps of forming the TFTs 75 and 76 is described.

In the manufacturing method of this embodiment mode, the first electrode 105 of the antifuse 71 is formed in the same steps as the gate electrodes 114 and 115 of the TFTs. As a result, the first electrode 105 is formed of the same conductive film as the gate electrodes 114 and 115. In addition, the second electrode 106 is formed in the same steps as the electrodes 116 to 118, each of which functions as the source electrode or the drain electrode of the TFTs. As a result, the second electrode 106 is formed of the same conductive film as the electrodes 116 to 118.

For formation of the semiconductor device 50, the insulating film 101 is formed to have a single-layer structure or a multilayer structure including two or more layers over the substrate 100. The insulating film 101 can be formed of a single-layer film formed of a material selected from silicon oxide ($SiO_x$), silicon nitride ($SiN_x$), or silicon oxynitride ($SiO_xN_y$) or a multilayer film thereof. The insulating film can be formed by a sputtering method, a CVD method, or the like.

Next, a crystalline semiconductor film is formed over the insulating film 101. For example, the crystalline semiconductor film is formed by the following method: an amorphous silicon film is formed by a sputtering method, an LPCVD method, a plasma CVD method, or the like, and this amorphous silicon film is crystallized by laser irradiation, heat treatment in an electric furnace, or the like. This crystalline semiconductor film is processed into a predetermined shape by etching, whereby the semiconductor films 112 and 113 are formed. The semiconductor films 112 and 113 are formed of the crystalline semiconductor film, whereby the drive frequency of the TFTs 75 and 76 of the driver circuit portion can be increased and the driving voltage of the TFTs 75 and 76 can be reduced. As a result, high-speed data reading from the memory portion 51 is realized, and power consumption can be reduced.

If necessary, a small amount of impurity element (boron or phosphorus) imparting p-type conductivity or n-type conductivity can be added to the crystalline semiconductor film in order to control the threshold values of the TFTs 75 and 76.

Next, the insulating film 102 is formed to cover the semiconductor films 112 and 113. The insulating film 102 can be formed of a similar material to the insulating film 101. The insulating film 102 may be either a single-layer film or a multilayer film of two or more layers. As a formation method of the insulating film 102, there is a method in which a single-layer film or a multilayer film is formed to a thickness of 1 to 200 nm by a plasma CVD method or a sputtering method. As another method, there is a method in which a single-layer film or a multilayer film is formed to a thickness of 1 to 20 nm by a plasma CVD method or a sputtering method and then surface nitriding treatment using microwave plasma is performed on the film.

Next, in the driver circuit portion 56, the gate electrodes 114 and 115 which respectively overlap with the semiconductor films 112 and 113 are formed with the insulating film 102 interposed therebetween. In the memory portion 51, the first electrode 105 is formed. A conductive film which forms these electrodes 105, 114, and 115 may be a single-layer film or a multilayer film of two or more layers. After the conductive film is formed, the conductive film is processed into predetermined shapes by etching, whereby the first electrode 105 of the antifuse 71 and the gate electrodes 114 and 115 of the TFTs 75 and 76, respectively, are formed.

A part (a layer corresponding to the first conductive layer 11 of each of FIGS. 1A and 1B, FIGS. 2A and 2B, FIG. 3, and FIG. 4) of the conductive film which forms the first electrode 105 and the gate electrodes 114 and 115, which is in contact with the intermediate layer 107, is formed of a metal selected from Ti, W, Ni, Cr, Mo, Ta, Co, Zr, V, Pd, Hf, Pt, or Fe, or an alloy of the metal or a compound of the metal. The above-described material is used in order to make the intermediate layer 107 react with the first electrode 105 to make the antifuse 71 conductive. The layer formed of the above-described conductive material can be formed by an evaporation method or a sputtering method.

It is preferable that a material having both characteristics suitable for an antifuse conductive layer and characteristics suitable for the gate electrode of the transistor be selected for the conductive films which forms the first electrode 105 and the gate electrodes 114 and 115. As one of such materials, tungsten is given.

A tungsten film reacts with silicon to form tungsten silicide. In addition, the tungsten film reacts with germanium to form tungsten germanite. Therefore, the tungsten film is suitable for the conductive layer of the antifuse. In addition, tungsten is a material which has a relatively high work function, and threshold voltage of both a p-channel transistor and an n-channel transistor is low and the values are almost the same. Tungsten is one of preferable materials for the gate electrode.

Next, a resist mask is formed to cover a region where the p-channel TFT 76 is formed is formed, and an impurity element imparting n-type conductivity is added to the semiconductor film 112. The impurity element imparting n-type conductivity is added to the semiconductor film, whereby n-type high concentration impurity regions 121 and 122 are formed in a self-alignment manner. In a region of the semiconductor film, which overlaps with the gate electrode 114, the channel formation region 120 is formed. The impurity element imparting n-type conductivity may be added to the semiconductor film 112 by an ion doping method or an ion injecting method. Phosphorus (P) or arsenic (As) is used as a typical impurity element imparting n-type conductivity.

After the resist mask for covering the region where the p-channel TFT is formed is removed, another resist mask is formed to cover a region where the n-channel TFT is formed is formed. Then, an impurity element imparting p-type conductivity (typically, boron) is added to the semiconductor film 113. As a result, p-type high concentration impurity regions 124 and 125 are formed in the semiconductor film 113 in a self-alignment manner, and a region which overlaps with the gate electrode 115 is a channel formation region 123.

After that, the resist mask is removed. Note that, although the example in which the impurity element imparting n-type conductivity is added first is shown in this embodiment mode, the order of doping may be opposite to that. In addition, an impurity element imparting n-type or p-type conductivity is added after an insulator called a sidewall is formed on side walls of the gate electrode, whereby LDD regions which are adjacent to the channel formation region can be formed. Such steps is described in Embodiment 2.

Next, the impurity elements added to the semiconductor films 112 and 113 are activated. The impurity elements are activated by high-temperature heat treatment in a furnace or heat treatment by irradiation with lamp light or laser light. Therefore, the first electrode 105 and the gate electrodes 114 and 115 are formed of a conductive film which can withstand this heat treatment. Tungsten is a refractory metal and is a material which can withstand the heat treatment for activating the impurity elements.

Next, the insulating film 103 is formed to cover the gate electrode 114, the gate electrode 115, and the first electrode 105. The insulating film 103 functions as a partition wall for insulating antifuses 71 of adjacent memory cells. Thus, the insulating film 103 is preferably formed of an insulating material which can withstand heat generated at the time of writing to the antifuse 71. For example, the insulating film 103 can be formed of a single-layer film or a multilayer film of two or more layers of an inorganic insulating material, such as a silicon oxide film, a silicon nitride film, or a silicon oxynitride film. In the case of a multilayer film, one layer in the insulating film 103 can be formed using a siloxane resin with high heat resistance, which is obtained by a coating method.

In the steps up to here does not include steps peculiar to the manufacture of the antifuse 71, and there is no increase in the number of steps. The reason why there is no increase in the number of steps as described above is that the first electrode 105 which is a surface on which the intermediate layer 107 is to be formed is allowed to be exposed to air. This makes it possible to form the first electrode 105, the insulating film 103, and the openings in the insulating film 103 in the manufacturing steps of the TFTs.

Next, a resist mask is formed and the insulating films 102 and 103 are etched, whereby openings are formed. The etching may be performed by wet etching or dry etching, or a combination of wet etching and dry etching. Then, the resist mask is removed. The openings formed in this step are an opening reaching the first electrode 105 and an opening for forming the intermediate layer 107.

The size of the opening is preferably greater than or equal to 0.1 μm$^2$ and less than or equal to 30 μm$^2$. The size of the antifuse 71 is determined depending on the size of the opening. Note that there is no particular limitation on the shape of the opening, and the opening may be any of circular, elliptical, and rectangular.

Next, the intermediate layer 107 of the antifuse 71 is formed. The above-described formation steps of the opening and the intermediate layer 107 are steps peculiar to the antifuse 71 and added to the manufacturing process of the TFTs. In this embodiment mode, a formation method of the intermediate layer 107 is described using an example in which the semiconductor films 108 and 110 of the intermediate layer 107 are formed of amorphous silicon and the insulating film 109 of the intermediate layer 107 is formed of silicon oxynitride.

First, an amorphous silicon film, a silicon oxynitride film, and an amorphous silicon film are stacked over the insulating film 103. These three films can be continuously formed easily in one reaction chamber of a plasma CVD apparatus by control of types of material gas, flow rate of the material gas, and the like without taking out the substrate. Even if silicon oxide or silicon nitride is formed instead of silicon oxynitride, similarly, these three films can be formed continuously in one reaction chamber of the plasma CVD apparatus. Note that the amorphous silicon film and the silicon oxynitride film can also be formed in different reaction chambers of the plasma CVD apparatus having a plurality of reaction chambers.

The three-layer multilayer film formed of the amorphous silicon film, the silicon oxynitride film, and the amorphous silicon film is etched, whereby the intermediate layer 107 with a predetermined shape is formed. That is, for forming the intermediate layer 107, the following steps are performed: a step of forming the films which form the intermediate layer 107, photolithography for forming a resist mask, and a step of etching the formed films.

Next, a resist mask is formed and the insulating films 102 and 103 are etched, whereby openings are formed. The etching may be performed by wet etching or dry etching, or a combination of wet etching and dry etching. Then, the resist mask is removed. The openings which are formed in this step are three kinds of contact hole: contact holes reaching the semiconductor films 112 and 113, contact holes reaching the gate electrodes 114 and 115 of the TFTs, and a contact hole reaching the first electrode 105.

Note that these contact holes can also be formed when the opening for forming the intermediate layer 107 is formed in the insulating film 103. This makes it possible to reduce the number of steps. In this case, etching conditions for forming the intermediate layer 107 are adjusted so that the semiconductor films 112 and 113 and the gate electrodes 114 and 115 are not etched too much.

Next, a conductive film having a single-layer structure or a multilayer structure including two or more layers is formed over the insulating film 103 by a sputtering method. A resist mask is formed over the conductive film, and the conductive film is etched using the resist mask, whereby the second electrode 106 and the third electrode 111 are formed in the memory portion 51, and the electrodes 116 to 118 are formed in the driver circuit portion 56.

In this manner, the second electrode 106 can be formed in the same step as the electrodes 116 to 118, each of which functions as the source electrode or the drain electrode. This is because an upper surface of the intermediate layer 107 on which the second electrode 106 of the antifuse 71 is to be formed is allowed to be exposed to air.

A part (a layer corresponding to the second conductive layer 12 of each of FIGS. 1A and 1B, FIGS. 2A and 2B, FIG. 3, and FIG. 4) of the conductive film which forms these electrodes 106, 111, and 116 to 118, which is in contact with the intermediate layer 107 is formed of a conductive material which reacts with silicon and germanium and forms a material having lower resistance than silicon and germanium. As such a conductive material, the following metal can be given: tungsten (W), titanium (Ti), nickel (Ni), chromium (Cr), molybdenum (Mo), tantalum (Ta), cobalt (Co), zirconium (Zr), vanadium (V), palladium (Pd), hafnium (Hf), platinum (Pt), iron (Fe), or the like. An alloy of the metal or a compound of the metal can also be used as such a conductive material.

For example, the conductive film which forms the electrodes 106, 111, and 116 to 118 can be formed of a three-layer film of a Ti film with a thickness of 50 to 200 nm, a film containing aluminum as its main component (ex., a pure Al film) with a thickness of 100 to 400 nm, and a Ti film with a thickness of 50 to 200 nm. The Ti film is formed as the lowest layer, so that the amorphous silicon of the intermediate layer 107 reacts with titanium at the time of writing and titanium silicide can be generated.

Since this three-layer film includes the Ti films as the lowest layer and the uppermost layer, contact resistance with other conductive materials is low. In addition, since a film having resistivity which is far lower than titanium or tungsten, like the film containing aluminum as its main component, is used for a middle layer, this conductive film having the three-layer structure is suitable for a lead wiring of the driver circuit portion 56 or a lead wiring like the third electrode 111 of the memory portion 51.

Through the above-described steps, the memory portion 51 including the antifuse as the memory element and the driver circuit portion 56 including the TFTs 75 and 76 can be manufactured over the same substrate. In addition, the intermediate layer having the multilayer structure which is described in Embodiment Mode 1 is applied for the intermediate layer 107 of the antifuse 71, whereby the antifuse 71 can be manufactured as well as the TFTs 75 and 76 without making the manufacturing process complicated.

Although the TFT using a thin film semiconductor over a glass substrate is manufactured as a transistor in this embodiment mode, a transistor using a single crystal semiconductor substrate can be manufactured. In that case, a single crystal silicon substrate, a single crystal germanium substrate, an SOI substrate, or the like can be used as the substrate.

Embodiment 1

An antifuse including an intermediate layer having a three-layer structure including amorphous silicon, silicon oxynitride, and amorphous silicon and antifuses each including an intermediate layer having a two-layer structure including amorphous silicon and silicon oxynitride were manufactured, and electrical characteristics of the manufactured antifuses were measured. In this embodiment, the electrical characteristics are described.

FIG. 10, FIG. 11, FIG. 12, and FIG. 13 are each a cross-sectional view of the antifuse manufactured in this embodiment. In this embodiment, each of the antifuses was manufactured over a glass substrate 200. The antifuse shown in each of FIG. 10, FIG. 11, FIG. 12, and FIG. 13 is formed over a base insulating film 201 and includes a first electrode 202, a partition wall 203 which is formed of an insulating film, an intermediate layer 204, and a second electrode 205.

Figure 10:
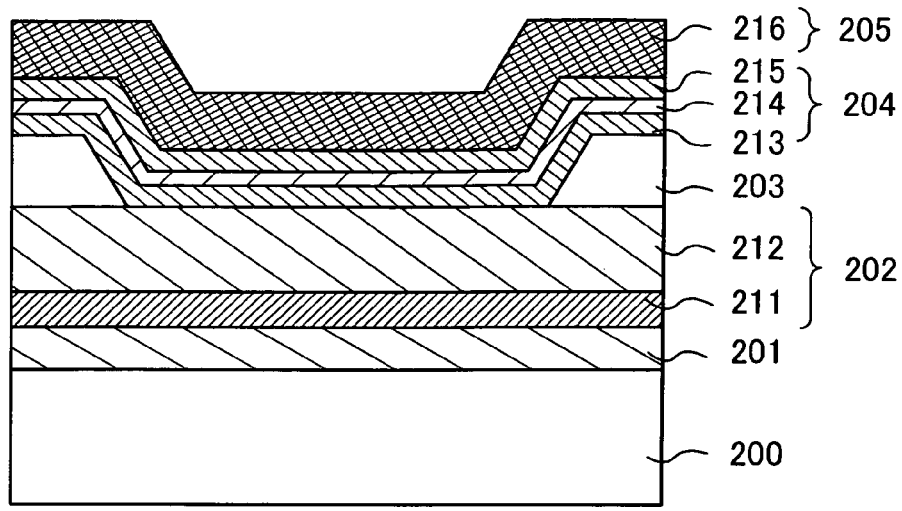
FIG. 10 is a cross-sectional view of an antifuse (an element A) of Embodiment 1.

The structures of the intermediate layers 204 of FIG. 10, FIG. 11, FIG. 12, and FIG. 13 are different from one another. The intermediate layer 204 shown in FIG. 10 is formed of a multilayer film having a three-layer structure in which an amorphous silicon film 213, a silicon oxynitride film 214, and an amorphous silicon film 215 are stacked in this order. The antifuse shown in FIG. 10 is referred to as an element A.

Figure 11:
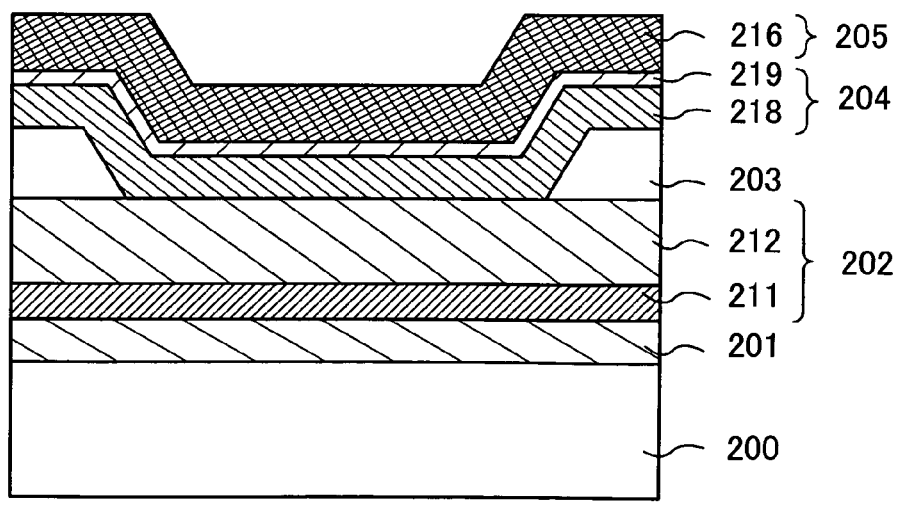
FIG. 11 is a cross-sectional view of an antifuse (an element B) of Embodiment 1.
Figure 12:
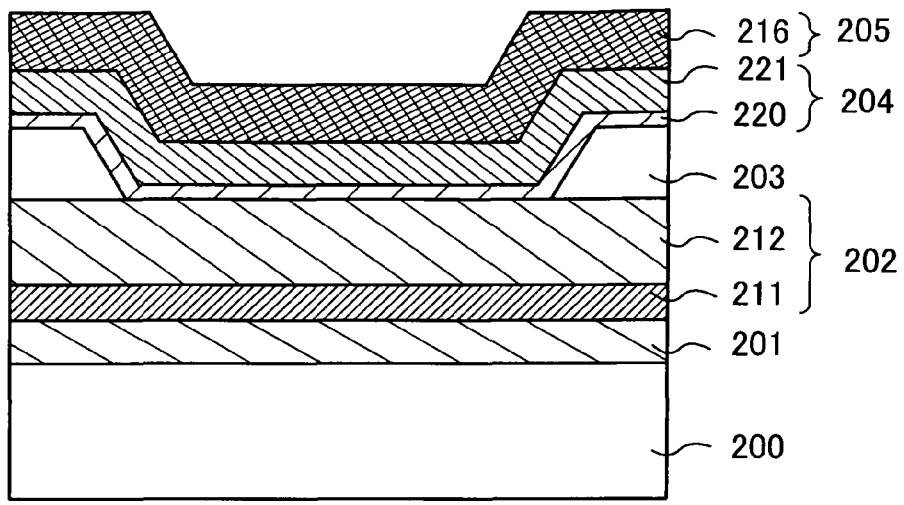
FIG. 12 is a cross-sectional view of an antifuse (an element C) of Embodiment 1.

The intermediate layer 204 shown in each of FIG. 11 and FIG. 12 has a two-layer structure. In this embodiment, the antifuse shown in FIG. 11 is referred to as an element B, and the antifuse shown in FIG. 12 is referred to as an element C. The intermediate layer 204 of the element B is a multilayer film in which an amorphous silicon film 218 and a silicon oxynitride film 219 are stacked in this order. The intermediate layer 204 of the element C is a multilayer film in which a silicon oxynitride film 220 and an amorphous silicon film 221 are stacked in this order.

Figure 13:
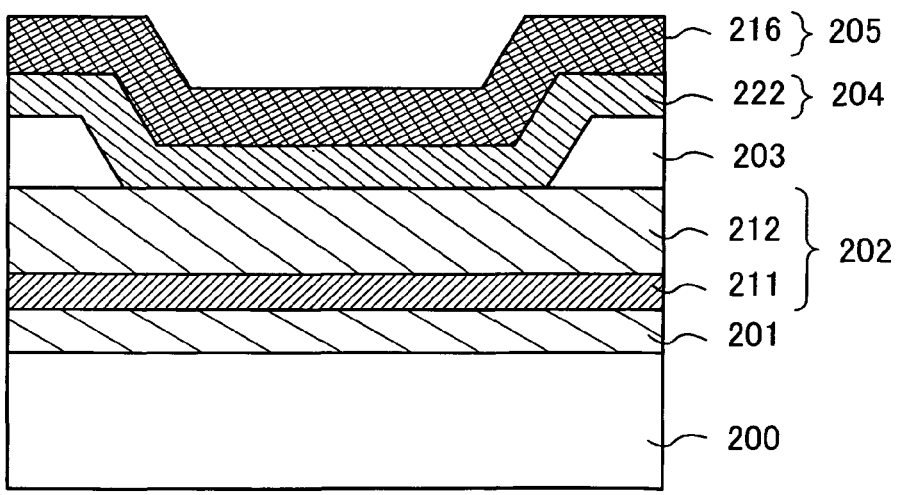
FIG. 13 is a cross-sectional view of an antifuse (a reference element) of a comparative example.

In addition, the antifuse shown in FIG. 13 is a comparative example, and the intermediate layer 204 of the antifuse is formed of a single-layer film of an amorphous silicon film 222. The antifuse shown in FIG. 13 is referred to as a reference element.

Next, a manufacturing method of the element A is described with reference to FIG. 10. The glass substrate 200 was prepared. Then, as the base insulating film 201, a silicon oxide film was formed to have a thickness of 200 nm using a sputtering apparatus. The first electrode 202 having a two-layer structure was formed over the base insulating film 201. In this embodiment, a tantalum nitride film 211 was formed to a thickness of 30 nm as a first layer, and a tungsten film 212 was formed to a thickness of 370 nm as a second layer. Both the tantalum nitride film 211 and the tungsten film 212 were formed using a sputtering apparatus.

Next, a resist mask was formed over the tungsten film 212, and in one of reaction chambers in a dry etching apparatus, the stacked film formed of the tantalum nitride film 211 and the tungsten film 212 was etched using the mask, whereby the first electrode 202 was formed. In this embodiment, an ICP (inductively coupled plasma) etching apparatus was used as the etching apparatus. The stacked film was etched in such a manner that a $Cl_2$ gas, an $SF_6$ gas, and an $O_2$ gas were first supplied to the reaction chamber to etch the tungsten film 212, and then only a $Cl_2$ gas was supplied to the reaction chamber to etch the tantalum nitride film 211.

Next, over the first electrode 202, a silicon oxynitride film was formed to a thickness of 500 nm to serve as the partition wall 203 using a parallel plate plasma CVD apparatus. $SiH_4$ and $N_2O$ were used as material gases for the silicon oxynitride film.

Next, a resist mask was formed over the partition wall 203, and the partition wall 203 was etched using a plasma etching apparatus, whereby an opening reaching the tungsten film 212 was formed. In this embodiment, a mixed gas of $CHF_3$ and He was used as an etching gas. In addition, the opening was formed so that a base thereof had a square shape with a size of 2 μm×2 μm.

Next, films for forming the intermediate layer 204 were formed over the tungsten film 212. In this embodiment, the amorphous silicon film 213 with a thickness of 25 nm, the silicon oxynitride film 214 with a thickness of 6 nm, and the amorphous silicon film 215 with a thickness of 25 nm were stacked over the partition wall 203. These films 213 to 215 were formed using a parallel plate plasma CVD apparatus provided with a plurality of reaction chambers, and the amorphous silicon films 213 and 215 were formed in a different reaction chamber from the reaction chamber in which the silicon oxynitride film 214 was formed. $SiH_4$ and $H_2$ were used as material gases for the amorphous silicon films 213 and 215, and SiH₄ and N₂O were used as material gases for the silicon oxynitride film 214.

Next, a titanium film was formed to a thickness of 50 nm over the amorphous silicon film 215 using a sputtering apparatus. The titanium film forms the second electrode 205.

Next, a resist mask was formed over the titanium film with a thickness of 50 nm, and the titanium film with a thickness of 50 nm and the stacked film formed of the amorphous silicon film 215, the silicon oxynitride film 214, and the amorphous silicon film 213 were etched using the resist mask so that these films were processed into predetermined shapes. A plasma etching apparatus was used for the etching. By this etching, the intermediate layer 204 formed of the amorphous silicon film 215, the silicon oxynitride film 214, and the amorphous silicon film 213 was formed.

Next, with use of a sputtering apparatus, a titanium film was formed to a thickness of 200 nm over the titanium film with a thickness of 50 nm over the amorphous silicon film 215. A resist mask was formed over this titanium film, and the titanium film was etched using the mask so that the titanium film was processed into a predetermined shape. In this embodiment, the 200-nm-thick titanium film was processed into a wiring. The second electrode 205 is formed of a 250-nm-thick titanium film 216.

Through the above-described steps, the element A was formed. As for the element B, the element C, and the reference element, only formation steps of films which form the intermediate layer 204 of the elements are differ from those of the element A. As the intermediate layer 204 of the element B, the amorphous silicon film 218 was formed to a thickness of 50 nm and the silicon oxynitride film 219 was formed to a thickness of 6 nm. As the intermediate layer 204 of the reference element, the amorphous silicon film 222 was formed to a thickness of 50 nm.

Note that the amorphous silicon films of the intermediate layers 204 of the element A, the element B, and the reference element were formed using SiH₄ and H₂ as material gases using a parallel plate plasma CVD apparatus. In addition, the silicon oxynitride films of the intermediate layers 204 of the element A, the element B, and the element C were formed with use of SiH₄ and N₂O as material gases using a parallel plate plasma CVD apparatus.

Although the structures of the intermediate layers 204 of the element A, the element B, and the element C are different from one another, each element is formed so that the intermediate layer 204 of the element has a thickness of 56 nm, that is, the distance between the first electrode 202 and the second electrode 205 of each element is the same. In addition, the amorphous silicon films included in the intermediate layer 204 of the element A are formed to a thickness of 50 nm, and the amorphous silicon film included in the intermediate layer 204 of each of the elements B and C is formed to a thickness of 50 nm.

In addition, the reference element differs from the elements A to C in that its intermediate layer 204 has a single-layer structure and is common to the elements A to C in that the total thickness of the amorphous silicon film included in the intermediate layer 204 is 50 nm.

Next, electrical characteristics of the element A, the element B, and the reference element are described. FIG. 14 is a graph showing current-voltage characteristics obtained when the element A was placed in a conductive state from a nonconductive state. FIG. 15 is a graph showing current-voltage characteristics obtained when the element B was placed in a conductive state from a nonconductive state. FIG. 16 is a graph showing current-voltage characteristics obtained when the element C was placed in a conductive state from a nonconductive state. In addition, FIG. 17 is a graph showing current-voltage characteristics obtained when the reference element was placed in a conductive state from a nonconductive state. The horizontal axis of each of FIG. 14, FIG. 15, FIG. 16, and FIG. 17 indicates the value of voltage applied between the first electrode 202 and the second electrode 205, and the vertical axis thereof indicates the value of current flowing between the first electrode 202 and the second electrode 205. Note that the measurement of each of the element A, the element B, and the reference element was performed in such a manner that the voltage applied between the first electrode 202 and the second electrode 205 was increased in stages by 0.1 V each time from 0 to 15V, while the measurement of the element C was performed in such a manner that the voltage applied between the first electrode 202 and the second electrode 205 was increased in stages by 0.1 V each time from 0 to 10 V.

As shown in FIG. 14, FIG. 15, and FIG. 16, the current (the consumption current) which flows right before each of the element A, the element B, and the reference element is placed in the conductive state is about 1 μA. As shown in FIG. 17, on the other hand, the consumption current of the reference element is about 10 μA. That is, the current which flows right before each of the element A, the element B, and the element C is placed in the conductive state is decreased to 1/10 of the current which flows right before the reference element is placed in the conductive state. Note that FIG. 14, FIG. 15, and FIG. 17 show the data obtained by the measurement of given 25 elements over the same substrate.

FIG. 18 is a graph showing power consumption at the time of writing to each of the element A, the element B, and the reference element. The power consumption was calculated from the writing voltage and the consumption current obtained from the measurement results shown in FIG. 14, FIG. 15, and FIG. 17. The writing voltage is the voltage which is applied to an antifuse when the antifuse is in a conductive state. The power consumption was calculated by multiplication of the writing voltage and the consumption current. FIG. 18 shows the data obtained by the measurement of given 42 elements over the same substrate.

Tables 1 to 4 given below relate to the elements A to C and the reference element, respectively, and each Table shows the maximum value, minimum value, and average value of the writing voltage, consumption current, and power consumption of each element. The values in Tables 1 to 4 were calculated from the current-voltage characteristics shown in FIG. 14 to FIG. 17, respectively.

According to FIG. 18, each of the element A and the element B have little variation in power consumption among the elements. In addition, according to Tables 1 to 4, the maximum values of power consumption of the element A, the element B, and the element C are respectively less than or equal to 1/2, less than or equal to 1/4, and less than or equal to 2/3 of the maximum value of power consumption of the reference element. In addition, the average values of power consumption of the element A, the element B, and the element C are respectively about 1/2, about 1/5, and less than or equal to 1/3 of the average value of power consumption of the reference element.

TABLE 1

Element A

| | Writing voltage [V] | Consumption current [μA] | Power consumption [μW] |
|---|---|---|---|
| Maximum value | 9.70 | 2.23 | 21.41 |
| Minimum value | 8.40 | 0.93 | 8.87 |
| Average value | 9.33 | 1.43 | 13.32 |

TABLE 2

Element B

| | Writing voltage [V] | Consumption current [μA] | Power consumption [μW] |
|---|---|---|---|
| Maximum value | 7.60 | 1.64 | 12.14 |
| Minimum value | 6.30 | 0.56 | 3.61 |
| Average value | 7.03 | 0.95 | 6.70 |

TABLE 3

Element C

| | Writing voltage [V] | Consumption current [μA] | Power consumption [μW] |
|---|---|---|---|
| Maximum value | 8.90 | 4.67 | 35.96 |
| Minimum value | 6.30 | 0.04 | 0.32 |
| Average value | 8.10 | 1.14 | 9.01 |

TABLE 4

Reference element

| | Writing voltage [V] | Consumption current [μA] | Power consumption [μW] |
|---|---|---|---|
| Maximum value | 5.70 | 9.72 | 54.44 |
| Minimum value | 4.80 | 2.56 | 12.31 |
| Average value | 5.31 | 6.20 | 33.30 |

Therefore, although the thickness of the amorphous silicon films in the intermediate layer included in the element A and the thicknesses of the amorphous silicon films in the intermediate layers included in the elements B and C and the reference element are the same as one another, each of the elements A to C includes the intermediate layer having the multilayer structure, whereby the amount of current which flows at the time of writing to each element is less than that of the reference element having the single-layer structure, and as a result, the power consumption at the time of writing to each of the elements A to C is reduced. Furthermore, variation in power consumption at the time of writing to each of the elements A to C having the multilayer structure is less than that of the reference element.

FIG. 19 is a graph showing current-voltage characteristics of the element A after being placed in a conductive state, and shows the data obtained by the measurement of the same elements as those used in the measurement of the data shown in FIG. 14. FIG. 20 is a graph showing current-voltage characteristics of the element B after being placed in a conductive state, and shows the data obtained by the measurement of the same elements as those used in the measurement of the data shown in FIG. 15. In addition, FIG. 21 is a graph showing current-voltage characteristics of the reference element after being placed in a conductive state, and shows the data obtained by the measurement of the same elements as those used in the measurement of the data shown in FIG. 17. The horizontal axis of each of FIG. 19, FIG. 20, and FIG. 21 indicates the value of voltage applied between the first electrode 202 and the second electrode 205, and the vertical axis thereof indicates the value of current flowing between the first electrode 202 and the second electrode 205. Each of FIG. 19, FIG. 20, and FIG. 21 shows the data obtained by the measurement of the value of current flowing between the first electrode 202 and the second electrode 205 of each of the element A, the element B, and the reference element. In the measurement, the voltage applied between the electrodes is increased in stages by 0.1 V each time from 0 V. Note that the measurable maximum value of current in this measurement is 2.0 mA. In addition, each of FIG. 19, FIG. 20, and FIG. 21 shows the data obtained by the measurement of given 25 elements over the same substrate.

FIG. 19 shows that the resistance values of 25 elements A are decreased by writing operation and the values are less than or equal to 50Ω and homogeneous. Similarly, FIG. 20 shows that the resistance values of 25 elements B are decreased by writing operation and the values are less than or equal to 50Ω and homogeneous. That is, by the writing operation, the plurality of elements A and the plurality of elements B each have no variation in the resistance values, is electrically-stable, and placed in a uniform conductive state. On the other hand, FIG. 21 shows that 25 reference elements right after writing operation have variation in the resistance values, and even the minimum resistance value is about 300Ω. In other words, FIG. 21 shows that the resistance of the reference element is not sufficiently reduced by the writing operation and electrical connection between the first electrode and the second electrode is unstable. That is, the data of each of FIG. 19, FIG. 20, and FIG. 21 shows that fewer data reading errors occur in the elements A and B each including the intermediate layer having the multilayer structure than in the reference element including the intermediate layer formed of one semiconductor film.

In the manufacturing process of each of the elements A to C and the reference element, after an upper surface of the tungsten film 212 was exposed to air, the intermediate layer 204 was formed over the upper surface. In addition, after an upper surface of the intermediate layer 204 was exposed to air, the titanium film 216 is formed over the upper surface to form the second electrode 205. It is to be noted that the electrical characteristics shown in FIG. 14 to FIG. 21 are the characteristics of the antifuses which were formed through the process including exposure to an atmosphere containing oxygen, like air.

Embodiment 2

In this embodiment, an example in which the present invention is applied to a semiconductor device which is capable of inputting and outputting data without contact will be described. The semiconductor device capable of inputting and outputting data without contact is also referred to as an RFID tag, an ID tag, an IC tag, an IC chip, an RF tag, a wireless tag, an electronic tag, or a wireless chip depending on its usage.

Figure 22:
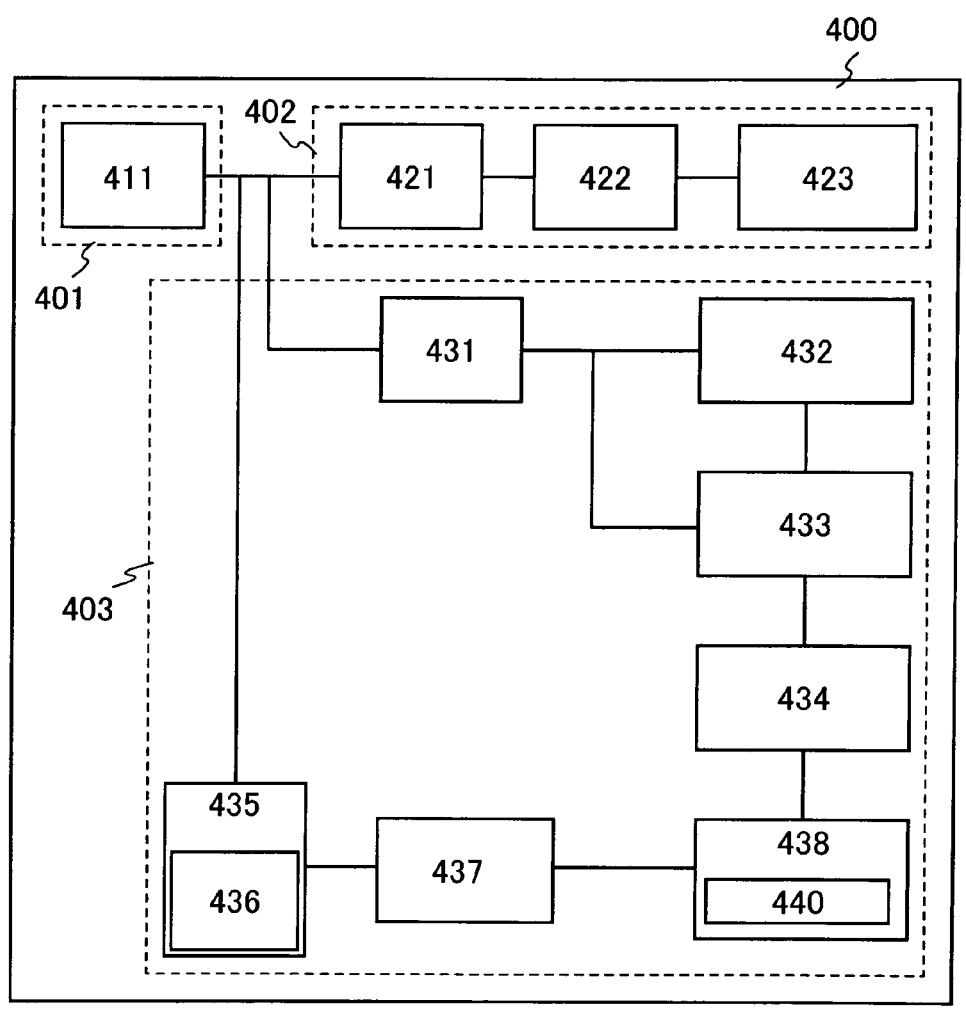
FIG. 22 is a block diagram illustrating a structural example of a semiconductor device which is capable of noncontact data transmission.

First, a structure of a semiconductor device which is capable of noncontact data transmission is described with reference to FIG. 22. FIG. 22 is a block diagram illustrating a structural example of the semiconductor device which is capable of noncontact data transmission. A semiconductor device 400 of this embodiment is mainly constituted by an antenna portion 401, a power supply portion 402, and a logic portion 403.

The antenna portion 401 includes an antenna 411 for receiving external signals and transmitting data. The antenna 411 which is optimum for a transmission method of the semiconductor device 400 is provided. A signal transmission method of the semiconductor device 400 can be any of an electromagnetic coupling method, an electromagnetic induction method, a microwave method, and the like. The transmission method is selected by a practitioner in consideration of application use.

The power supply portion 402 includes a rectifier circuit 421, a storage capacitor 422, and a constant voltage circuit 423. The rectifier circuit 421 is a circuit which is used for generating voltage from electric waves received by the antenna portion 401. The storage capacitor 422 is a circuit which is used for storing the voltage generated by the rectifier circuit 421. The constant voltage circuit 423 is a circuit for which is used for making the voltage generated by the rectifier circuit 421 constant.

The logic portion 403 includes a demodulation circuit 431, a clock generation/correction circuit 432, a code recognition/judgment circuit 433, a memory controller 434, a modulating circuit 435, an encoding circuit 437, and a memory device 438 for storing data.

The demodulation circuit 431 is a circuit for demodulating a received signal. The clock generation/correction circuit 432 is a circuit for generating a clock signal and correcting the clock signal.

The code recognition/judgment circuit 433 is a circuit for recognizing a code included in the received signal and judging the code. A code recognized and judged by the code recognition/judgment circuit 433 is a frame termination (EOF, end of frame) signal, a frame start (SOF, start of frame) signal, a flag, a command code, a mask length, a mask value, or the like. The code recognition/judgment circuit 433 also has a cyclic redundancy check (CRC) function for discriminating transmission errors. The modulation circuit 435 includes a modulation resistor 436.

The memory controller 434 is a circuit for generating, based on the received signal, a signal for reading data from the memory device 438. The encoding circuit 437 is a circuit for encoding data such as data read from a memory. The modulation circuit 435 includes the modulation resistor 436 and is a circuit for modulating encoded data by the encoding circuit 437 and making the data included in a transmission signal.

The memory device 438 includes at least a read-only memory circuit, a so-called ROM 440. The semiconductor device 50 described in Embodiment Mode 2 in which the antifuse is used in the memory element is applied to the ROM 440. The memory device 438 includes a memory circuit which is capable of rewriting according to need as well as the ROM. As the memory circuit capable of rewriting, the following can be used, for example: a DRAM, an SRAM, an FeRAM, an EPROM, an EEPROM, a flash memory, or the like.

In addition, the semiconductor device 400 of this embodiment is a flexible device which can be flexed or bent. The variety of circuits and the antenna included in the semiconductor device 400 are fixed not to a substrate used for manufacturing the circuits but to another flexible substrate.

Hereinafter, a manufacturing method of the semiconductor device 400 including the antenna portion 401, the power supply portion 402, and the logic portion 403 is described with reference to FIGS. 23A to 23C, FIGS. 24A to 24C, FIGS. 25A and 25B, and FIGS. 26A and 26B. FIGS. 23A to 26B are cross-sectional views illustrating the manufacturing method of the semiconductor device. In FIGS. 23A to 26B, thin film transistors (TFTs) are shown as the power supply portion 402 and the logic portion 403. Note that, in the power supply portion 402 and the logic portion 403, a variety of elements such as a diode, a resistor, and a capacitor are formed as well as the thin film transistor in accordance with performance of a circuit.

In addition, in FIGS. 23A to 26B, although the ROM 440 is a part of the logic portion 403, the ROM 440 is shown separately from the logic portion 403. In this embodiment, as a typical cross-sectional view of the ROM 440, a cross section of a memory cell is shown. In this embodiment, a structure of the memory cell is the active matrix type shown in FIGS. 2A and 2B, and an antifuse and a transistor which are formed in the memory cell are shown in FIGS. 23A to 26B. Note that not only the memory cell but also a bit line driver circuit, a word line driver circuit, and the like are included in the ROM 440. In these circuits, a diode, a resistor, and a capacitor are formed as well as the thin film transistor.

First, as shown in FIG. 23A, a metal layer 502 for serving as a separation layer is formed over a substrate 501. A glass substrate is used as the substrate 501. As the metal layer 502, any of a tungsten film, a tungsten nitride film, and a molybdenum film can be formed to a thickness of 30 to 200 nm. The film can be formed by a sputtering method.

Next, a metal oxide layer is formed by oxidation of a surface of the metal layer 502. In this embodiment, the metal oxide layer is not shown in the drawings. The metal oxide layer may be formed in such a manner that the surface of the metal layer 502 is oxidized with pure water, ozone water, or oxygen plasma. Alternatively, the metal oxide film may be formed by heating in an atmosphere containing oxygen. Further alternatively, the metal oxide layer may be formed in a later formation step of an insulating film. In that case, the surface of the metal layer 502 is oxidized when a silicon oxide film or a silicon oxynitride film is formed as the insulating film by a plasma CVD method, whereby the metal oxide layer is formed.

Next, an insulating film 503 is formed over the metal oxide layer. As the insulating film 503, an insulating film such as a silicon oxide film, a silicon nitride film, or a silicon oxynitride film ($SiO_xN_y$) is used. In the case where the insulating film 503 has a two-layer structure, a silicon oxynitride film is formed to a thickness of 50 to 100 nm as a first layer, with use of $SiH_4$, $NH_3$, and $N_2O$ as reaction gases by a plasma CVD method and a silicon oxynitride film is formed to a thickness of 100 to 150 nm as a second layer, with use of $SiH_4$ and $N_2O$ as reaction gases. Note that the amount of oxygen contained in the first silicon oxynitride film is higher than that of nitrogen.

Next, semiconductor layers 504 to 508 each of which constitutes a part of a semiconductor element such as a transistor are formed over the insulating film 503. Hereinafter, an example of a formation method of the semiconductor layers 504 to 508 is described. An amorphous silicon film is formed to a thickness of 40 to 80 nm by a plasma CVD method. The amorphous silicon film is irradiated with the second harmonic (532 nm) of an Nd:YVO$_4$ laser (fundamental wave: 1064 nm)

to be crystallized, whereby a crystalline silicon film is formed. A resist mask is formed over the crystalline silicon film, and the crystalline silicon film is etched into a desired shape using the resist mask. Through the above-described steps, the semiconductor layers 504 to 508 are formed.

The resist mask used for etching the crystalline silicon film is removed. Then, if necessary, the semiconductor layers 504 to 508 are doped with a small amount of impurity element (boron or phosphorus) in order to control threshold voltage of the TFTs. Then, surfaces of the semiconductor layers 504 to 508 are processed with etchant containing hydrofluoric acid. This hydrofluoric acid treatment is treatment for removing an oxide film on the surfaces of the semiconductor layers 504 to 508 and also for washing the surfaces of the semiconductor layers 504 to 508.

Then, an insulating film 509 is formed to cover the semiconductor layers 504 to 508. For example, the insulating film 509 is formed in such a manner that a single-layer film or stacked-layer film formed of silicon oxide or silicon oxynitride is formed to a thickness of 10 to 50 nm, and then surface nitriding treatment using microwave plasma is performed. The insulating film 509 functions as a gate insulating film of the TFTs.

Next, a first electrode 510 and gate electrodes 511 to 515 of the TFTs are formed over the insulating film 509. In this embodiment, these electrodes 510 to 515 are formed of a conductive film having a two-layer structure. First, a tantalum nitride film 517 is formed to a thickness of 20 to 40 nm by a sputtering method, and then a tungsten film 518 is formed to a thickness of 200 to 400 nm by a sputtering method. A resist mask is formed over the tungsten film 518. The multilayer film of the tantalum nitride film 517 and the tungsten film 518 is etched, whereby the first electrode 510 and the gate electrodes 511 to 515 are formed.

Next, a resist mask is formed to cover the semiconductor layers 505 and 507 of p-channel TFTs. An impurity element imparting n-type conductivity is added to the semiconductor layers 504, 506, and 508 of n-channel TFTs, using the gate electrodes 511, 513, and 515 as masks, whereby n-type low concentration impurity regions 521 to 526 are formed as shown in FIG. 23B. These n-type low concentration impurity regions 521 to 526 can function as LDD regions of the TFTs. As the impurity element imparting n-type conductivity, phosphorus (P), arsenic (As), or the like can be used. In the case of using phosphorus, phosphorus is preferably contained in the n-type low concentration impurity regions 521 to 526 at a concentration of $1\times10^{15}$ to $1\times10^{19}$/cm$^3$.

In addition, regions in the semiconductor layers 504, 506, and 508 to which the impurity element imparting n-type conductivity is not added in this step serve as channel formation regions 527 to 529, respectively.

Next, the resist mask is removed. Another resist mask is formed to cover the semiconductor layers 504, 506, and 508, and an impurity element imparting p-type conductivity is added to the semiconductor layers 505 and 507 of the p-channel TFTs, using the gate electrodes 512 and 514 as masks, whereby p-type high concentration impurity regions 531 to 534 are formed as shown in FIG. 23B. These high concentration impurity regions 531 to 534 each function as a source region or drain region of the TFT. In addition, regions in the semiconductor layers 505 and 507 to which the impurity element imparting p-type conductivity is not added in this step serve as channel formation regions 535 and 536, respectively.

As the impurity element imparting p-type conductivity, boron (B), aluminum (Al), gallium (Ga), or the like can be used. In the case of using boron, boron is preferably introduced into the p-type high concentration impurity regions 531 to 534 so as to be contained at a concentration of $1\times10^{19}$ to $1\times10^{20}$/cm$^3$.

Next, as shown in FIG. 23C, sidewalls 537 to 542 are formed on side surfaces of the first electrode 510 and the gate electrodes 511 to 515, respectively. The sidewalls 537 to 542 are formed as follows. First, an insulating film formed of silicon oxide, silicon oxynitride, or the like is formed by a plasma CVD method, a sputtering method, or the like so as to cover the insulating film 509, the first electrode 510, and the gate electrodes 511 to 515. Then, the insulating film is etched by anisotropic etching in which etching is performed mainly in a perpendicular direction with respect to the substrate. Accordingly, the sidewalls 537 to 542 which are in contact with the side surfaces of the first electrode 510 and the gate electrodes 511 to 515, respectively, are formed of the insulating film. Note that the insulating film 509 is also etched by the anisotropic etching for forming the sidewalls 537 to 542. Portions of the insulating film 509, which overlap with the electrodes 510 to 515 and the sidewalls 537 to 542, remain.

Next, a resist mask is formed so as to cover the semiconductor layers 505 and 507, and an impurity element imparting n-type conductivity is introduced into the semiconductor layers 504, 506, and 508, using the gate electrodes 511, 513, and 515 and the sidewalls 537, 540, and 542 as masks, whereby n-type high concentration impurity regions 544 to 549 are formed as shown in FIG. 23C. These high concentration impurity regions 544 to 549 each function as a source region or drain region of the TFT. In the case where the impurity element imparting n-type conductivity is phosphorus, phosphorus is introduced into the n-type high concentration impurity regions 544 to 549 so as to be contained at a concentration of $1\times10^{19}$ to $1\times10^{20}$/cm$^3$.

By this step of adding the impurity element imparting n-type conductivity, the n-type low concentration impurity regions 521 to 526 remain in the portions which overlap with the sidewalls 538, 540, and 542. These n-type low concentration impurity regions 521 to 526 can function as LDD regions.

Although in this embodiment, the example in which the LDD regions are formed in the n-channel TFTs not in the p-channel TFTs is shown, of course, the present invention is not limited to this structure. The LDD regions may be formed in both the n-channel TFT and the p-channel TFT. Alternatively, an n-channel TFT without LDD regions may be formed.

Next, an insulating film 550 containing hydrogen is formed by a sputtering method, an LPCVD method, a plasma CVD method, or the like. For example, as the insulating film 550 containing hydrogen, a silicon oxynitride film (an SiNO film) can be formed to a thickness of 50 to 200 nm with use of a hydrogen gas as a material gas by a plasma CVD method. Note that the insulating film 550 containing hydrogen is a first layer of an interlayer insulating film.

After the insulating film 550 is formed, activation treatment and hydrogenation treatment of the impurity element added to the semiconductor layers 504 to 508 is performed. Heat treatment in an electric furnace (at 300 to 500° C. for 1 to 12 hours), a rapid thermal annealing method (an RTA method) using a lamp light source, or the like can be employed for the activation treatment and hydrogenation treatment of the impurity element.

Figure 24A:
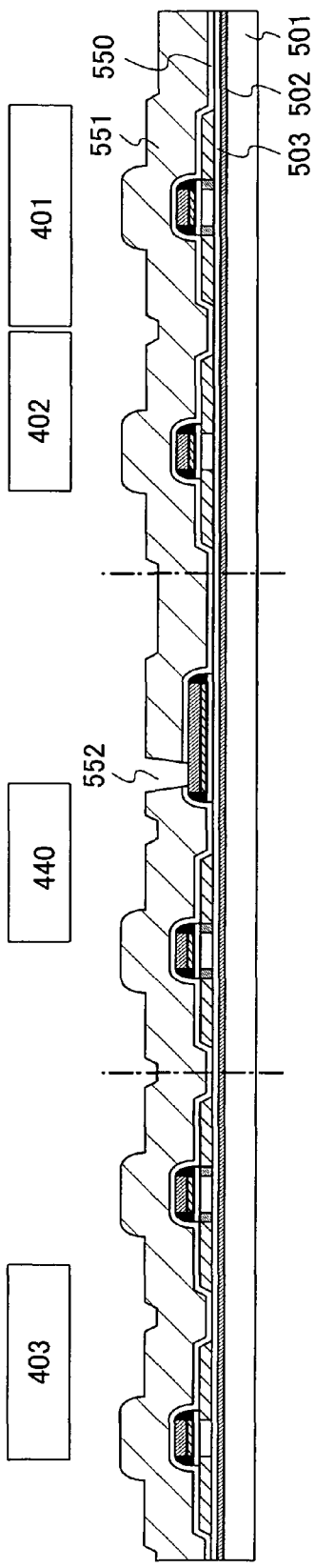
FIGS. 24A to 24C are cross-sectional views illustrating steps following the step of FIG. 23C.

Next, as shown in FIG. 24A, an insulating film 551 is formed to serve as a second layer of the interlayer insulating film by a sputtering method, an LPCVD method, a plasma CVD method, or the like. As the insulating film 551, a single layer of an insulating film such as a silicon oxide film, a silicon nitride film, or a silicon oxynitride film or a stacked layer thereof is used. In addition, the thickness of the insulating film 551 is set to 300 to 800 nm.

Next, a resist mask is formed over the insulating film 551. The insulating films 550 and 551 are etched using the resist mask, whereby an opening 552 reaching the first electrode 510 is formed as shown in FIG. 24A. The resist mask is removed after the etching.

Figure 24B:
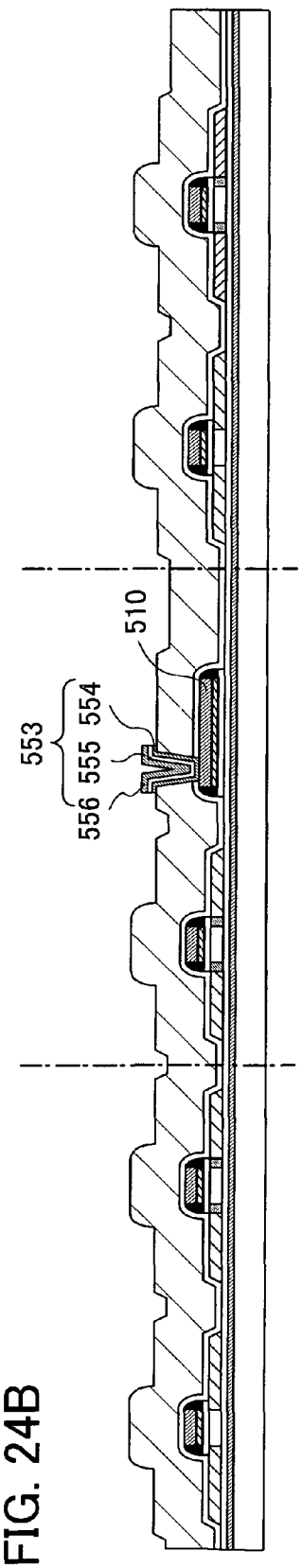
Figure 24C:
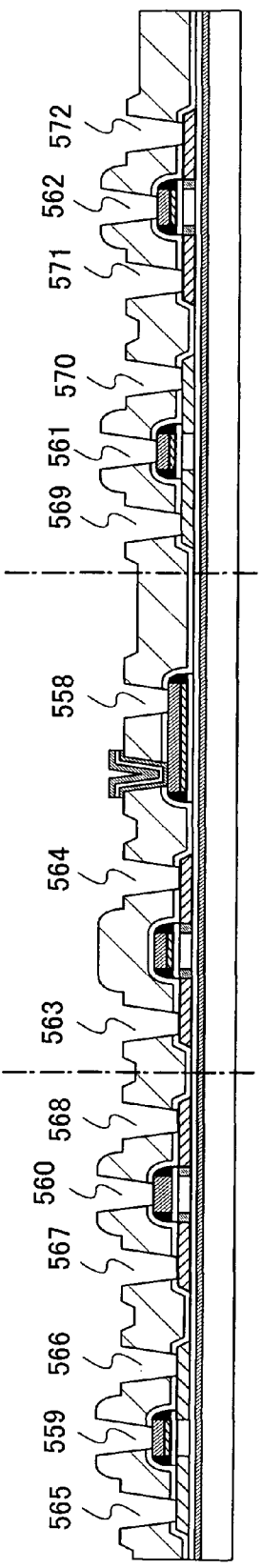

Next, as shown in FIG. 24B, an intermediate layer 553 of the antifuse is formed. In this embodiment, a three-layer structure including an amorphous silicon film 554, a silicon oxide film 555, and an amorphous silicon film 556 is used. The intermediate layer 553 is formed as follows. First, the amorphous silicon film 554, the silicon oxide film 555, and the amorphous silicon film 556 are stacked in this order over the insulating film 551 by a sputtering method, an LPCVD method, a plasma CVD method, or the like. Then, a resist mask is formed over the amorphous silicon film 556, and the stacked film formed of the amorphous silicon film 554, the silicon oxide film 555, and the amorphous silicon film 556 is etched into a predetermined shape. Accordingly, the intermediate layer 553 is formed. The intermediate layer 553 is in contact with the tungsten film 518 of the first electrode 510 at the base of the opening 552.

After the resist mask used for forming the intermediate layer 553 is removed, another resist mask is formed over the insulating film 551, and the insulating films 550 and 551 are etched using the resist mask, whereby the following are formed: an opening 558 reaching the first electrode 510, openings 559 to 562 reaching the gate electrodes 512 to 515, respectively, openings 563 and 564 reaching the semiconductor layer 504, openings 565 and 566 reaching the semiconductor layer 505, openings 567 and 568 reaching the semiconductor layer 506, openings 569 and 570 reaching the semiconductor layer 507, and openings 571 and 572 reaching the semiconductor layer 508. The resist mask is removed after the etching.

Figures 25A, 25B:
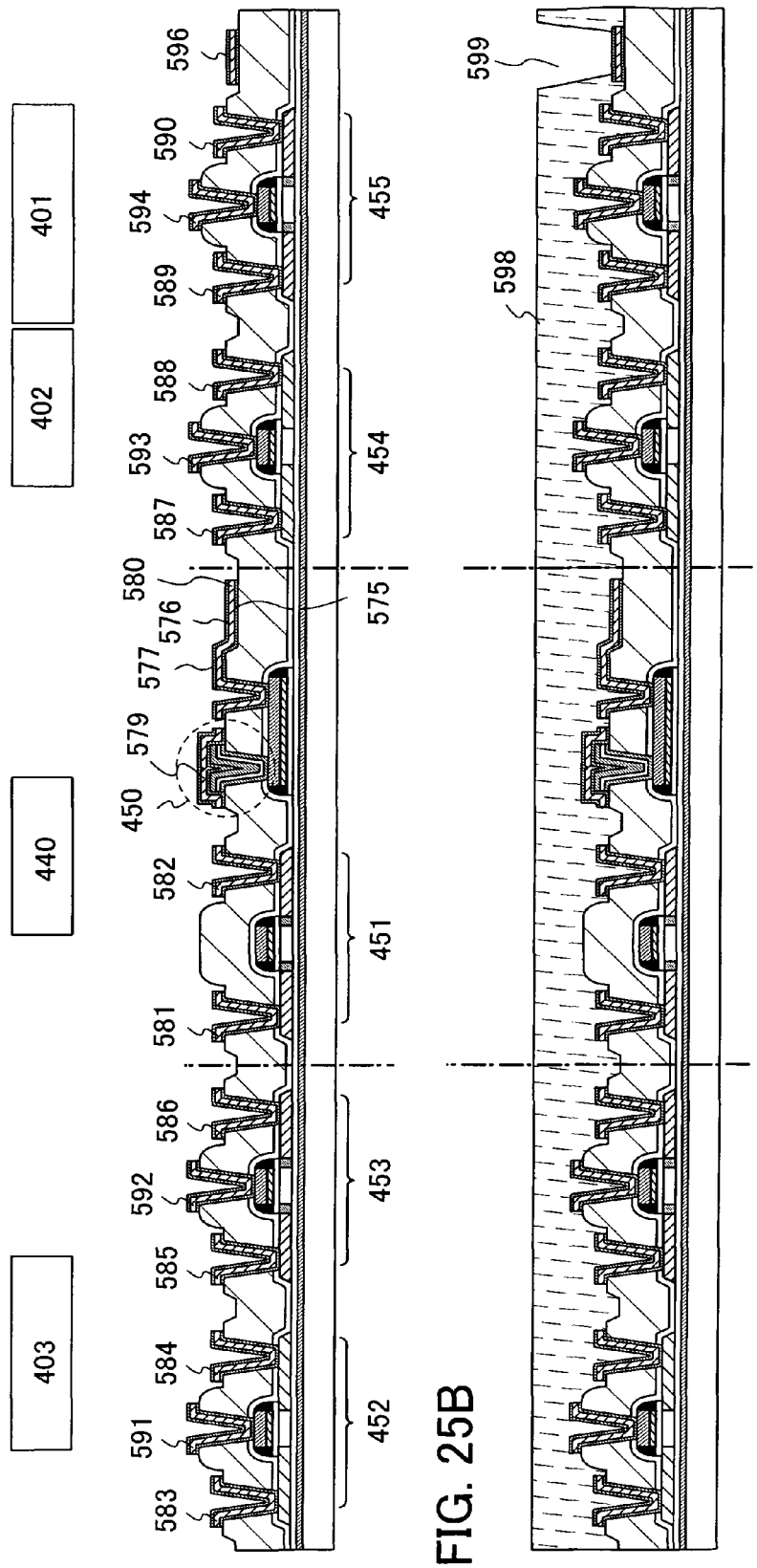
FIGS. 25A and 25B are cross-sectional views illustrating steps following the step of FIG. 24C.

Next, as shown in FIG. 25A, a second electrode of the antifuse, a source electrode and a drain electrode of the TFT, and the like are formed. In order to form these electrodes, first, a conductive film is formed by a sputtering method. In this embodiment, a conductive film having a three-layer structure is formed in which a Ti film 575 with a thickness of 100 nm, a pure Al film 576 with a thickness of 350 nm, and a Ti film 577 with a thickness of 100 nm are stacked in this order. The Ti film 577 functions as a second conductive layer of the second electrode of the antifuse.

Next, a resist mask is formed, and the conductive film formed of the Ti film 575, the pure Al film 576, and the Ti film 577 is etched using the resist mask to be processed into a predetermined shape. As a result, as shown in FIG. 25A, the following are formed: a second electrode 579, a third electrode 580, electrodes 581 to 590, each of which functions as the source electrode or the drain electrode, gate lead wirings 591 to 594 connected to the gate electrodes 512 to 515, respectively, and an electrode 596 in the antenna portion 401, which is connected to an antenna.

Note that, although the gate lead wirings 591 to 594 overlap with the semiconductor layers 505 to 508, respectively, in FIG. 25A, for convenience of explanation, it is preferable that the gate lead wirings 591 to 594 be formed so as not to overlap with the semiconductor layers 505 to 508, respectively. In addition, all of these lead wirings 591 to 594 for the gate electrodes 512 to 515, respectively, are not necessarily formed.

Through the above-described steps, an antifuse 450 formed of the first electrode 510, the intermediate layer 553, and the second electrode 579 is formed in the ROM 440. The first electrode 510 is connected to the third electrode 580 functioning as a lead wiring. In addition, an n-channel TFT 451 including the semiconductor layer 504 is formed. One of electrodes 581 and 582 of the TFT 451 is connected to a bit line of a memory cell, and the other is connected to the first electrode 510 of the antifuse 450 through the third electrode 580. The gate electrode 511 of the TFT 451 is connected to a word line.

In the logic portion 403, a p-channel TFT 452 including the semiconductor layer 505 and an n-channel TFT 453 including the semiconductor layer 506 are formed. In the power supply portion 402, a p-channel TFT 454 including the semiconductor layer 507 and an n-channel TFT 455 including the semiconductor layer 508 are formed.

A cross-sectional view of the semiconductor device after the above-described steps corresponds to FIG. 25A. Nine photomasks are used for forming the resist masks in the above-described steps, and two more photomasks are used for manufacturing the antifuse: one of the photomasks is used for forming the opening 552 and the other is used for forming the intermediate layer 553.

Next, as shown in FIG. 25B, an insulating film 598 is formed to cover the antifuse 450 and the TFTs 451 to 455. As the insulating film 598, an insulating film containing silicon oxide or an organic resin film is used. Then, a resist mask is formed, and the insulating film 598 is selectively etched, whereby an opening 599 reaching the electrode 596 is formed. Note that in the case where the insulating film 598 is formed of a photosensitive resin material, the etching step is not needed. In that case, the opening 599 can be formed in such a manner that an uncured photosensitive resin is exposed to light and developed.

Next, a conductive film is formed over the insulating film 598. As the conductive film, a single layer formed of an element selected from Ti, Ni, or Au, or a stacked layer thereof is used. A resist mask is formed and the conductive film is etched, whereby a base film 600 for the antenna is formed as shown in FIG. 26A. The base film 600 is connected to the electrode 596. The base film 600 can be formed also in such a manner that the conductive film is selectively formed by a sputtering method using a metal mask without performing the etching treatment using the resist mask. The provision of the base film 600 for the antenna makes it possible to increase a contact area with the antenna.

Next, as shown in FIG. 26B, an antenna 411 is formed over the base film 600. The antenna 411 can be formed by a method in which a metal film of Al, Ag, or the like is formed by a sputtering method and then processed into a predetermined shape by etching, or a method in which a metal with a predetermined shape is formed by a screen printing method or the like. If priority is given to reduction in the number of photomasks, the antenna is formed by a screen printing method.

A cross-sectional view of the semiconductor device 400 after the above-described steps corresponds to FIG. 26B. In this embodiment, the method has been described in which the antifuse 450 and the TFT 451 in the ROM 440; the TFTs 452 and 453 in the logic portion 403; the TFTs 454 and 455 in the power supply portion 402; and the antenna 411 in the antenna portion 401 are formed over the same substrate 501 with use of eleven photomasks.

In addition, although the method using the photomask is employed as the method for patterning the resist in this embodiment, the patterning technique is not limited to this method. As the patterning technique, a resist material is formed to have a predetermined shape over a surface on which the resist material is to be formed by a droplet discharge method without using a photomask.

Next, the metal layer 502 and the substrate 501 are removed by separation. First, a trench reaching the metal layer 502 is formed in the stack over the substrate 501 by laser scribing. The formation of the trench leads to separation inside the metal oxide film, at an interface between the insulating film 503 and the metal oxide film, or at an interface between the metal oxide film and the metal layer 502. Thus, the semiconductor device 400 formed over the insulating film 503 can be separated from the substrate 501 with relatively less force without application of force from the outside. Note that an upper surface of the antenna 411 is sealed with a sealant such as a resin in advance before the formation of the trench.

The stack separated from the substrate 501 is one sheet including a plurality of semiconductor devices 400 shown in FIG. 26B. Then, the sheet including the semiconductor devices 400 is fixed to a sheet-like base. A flexible material is used for the sheet-like base. For example, plastic, paper, a prepreg, a ceramic sheet, or the like is used for the sheet-like base. The semiconductor devices 400 may be interposed between two sheet-like bases, and the sheet-like base is fixed to at least the insulating film 503 side from which the substrate 501 is separated. A bonding layer can be used for the fixation to the sheet-like base. As the bonding layer, any of a variety of curable adhesives such as a reactive curable adhesive, a thermal curable adhesive, and a photo curable adhesive such as an ultraviolet curable adhesive, and an anaerobic adhesive can be used. Alternatively, the fixation to the sheet-like base may be performed by room temperature bonding or the like without using the bonding layer.

The plurality of semiconductor devices 400 fixed to the sheet-like base is separated into individual semiconductor devices by a method such as cutting, dicing, laser cutting or the like. Accordingly, thin semiconductor device 400 is obtained.

In the semiconductor device 400, data can be written to the ROM 440 with wireless communication. A wireless signal is transmitted, the signal is received by the antenna 411, and the signal is processed by the logic portion 403, whereby information can be written to the ROM 440. Power consumption of the antifuse of the present invention at the time of writing is reduced; therefore, the antifuse 450 can be placed in a conductive state with use of power generated from the wireless signal in the power supply portion 402.

Thus, the use of the wireless signal makes it possible to perform writing to the ROM 440 of the semiconductor device 400 at any given time after manufacture of the semiconductor device. For example, writing can be performed to the ROM 440 after the semiconductor device 400 is fixed to the sheet-like base to be in a chip form or after the semiconductor device 400 is attached to an article. Of course, in the semiconductor device 400 of this embodiment, data can be written to the ROM 440 by input of a wired signal, not a wireless signal. In that case, writing is preferably performed before the substrate 501 is separated from the semiconductor device 400.

Although in this embodiment, the example in which the antenna 411 as well as the power supply portion 402 and the logic portion 403 is formed over the substrate 501 is described, the formation of the antenna 411 can be omitted. In that case, the formation of the base film 600 for the antenna is not needed. As the sheet-like base, an antenna substrate over which a conductive layer which serves as an antenna is used. The antenna substrate is mounted so that the antenna is electrically connected to the electrode 596 in the power supply portion 402.

The semiconductor device 400 of this embodiment functions as a wireless chip, and is compact, thin, and lightweight, and moreover flexible. Thus, even when the semiconductor device 400 is attached to an article, the appearance, design, and quality of the article are not deteriorated.

Figure 27A:
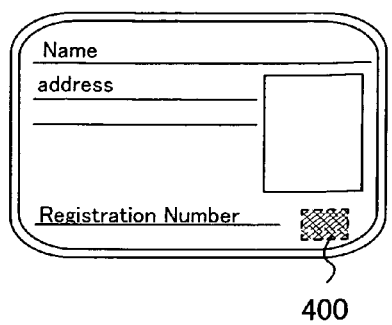
FIGS. 27A to 27F are external views of articles each including a semiconductor device which is capable of noncontact data transmission.
Figure 27B:
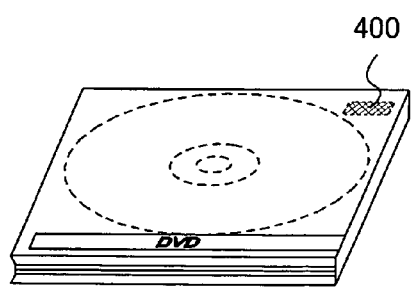
Figure 27C:
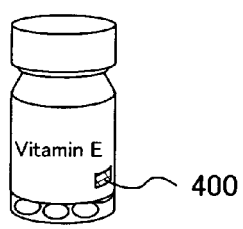
Figure 27D:
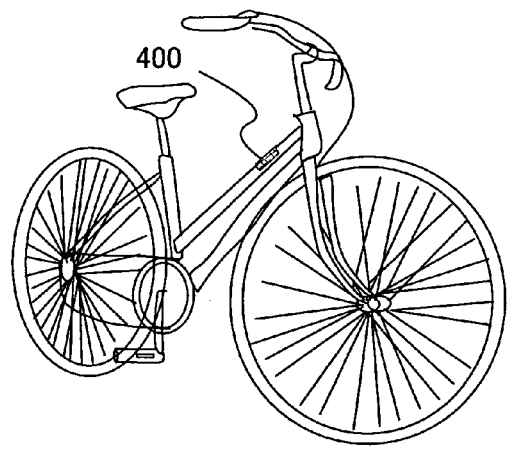
Figure 27E:
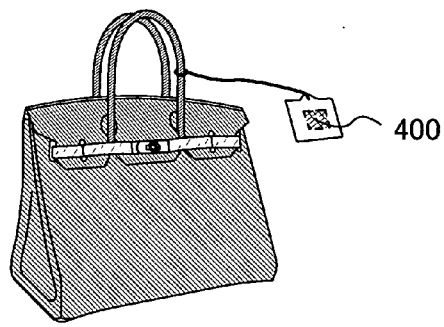
Figure 27F:
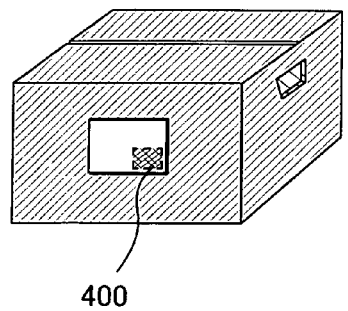

The semiconductor device 400 is fixed to an article by being mounted on a printed board, being attached to a surface of the article, being embedded in the article, or the like. The semiconductor device 400 shown in FIG. 27C is embedded in paper, and bills, securities, bear bonds, and documents are formed using the paper, whereby an authentication function be provided for these slips of paper. Accordingly, forgery can be prevented. In addition, the semiconductor device 400 is embedded in paper in this state or the semiconductor device 400 is interposed between two plastic substrates, whereby an IC card can be formed.

Usage of the semiconductor device 400 is described with reference to FIG. 27A to 27F. The wireless chip can be used widely and can be used by being provided in articles such as bills, coins, securities, bearer bonds, certificates (e.g., driver's licenses or resident cards, see FIG. 27A), recording media (e.g., DVDs or video tapes, see FIG. 27B), containers for wrapping (e.g., wrapping paper or bottles, see FIG. 27C), vehicles (e.g., bicycles, see FIG. 27D), products such as personal belongings (e.g., bags or glasses), food, plants, animals, clothes, everyday articles, or electronic appliances, or objects such as shipping tags of baggage (see FIGS. 27E and 27F).

This application is based on Japanese Patent Application serial no. 2007-064490 filed with Japan Patent Office on Mar. 14, 2007, the entire contents of which are hereby incorporated by reference.

What is claimed is:

1. A semiconductor device comprising:
a plurality of memory cells over a substrate, each comprising an antifuse,
wherein the antifuse comprises a first conductive layer, a second conductive layer, and an intermediate layer interposed between the first conductive layer and the second conductive layer,
wherein the intermediate layer is a multilayer film in which a semiconductor film and an insulating film are stacked,
wherein the semiconductor film is over and in direct contact with the first conductive layer, the insulating film is over and in direct contact with the semiconductor film, and the second conductive layer is over and in direct contact with the insulating film,
wherein a thickness of the semiconductor film is greater than or equal to 5 nm and less than or equal to 200 nm, and
wherein a thickness of the insulating film is greater than or equal to 1 nm and less than or equal to 20 nm.

2. The semiconductor device according to claim 1,
wherein the first conductive layer comprises a conductive material containing a metal element selected from the group consisting of Ti, W, Ni, Cr, Mo, Ta, Co, Zr, V, Pd, Hf, Pt, and Fe as a main component of the first conductive layer.

3. The semiconductor device according to claim 1,
wherein the second conductive layer comprises a conductive material containing a metal element selected from the group consisting of Ti, W, Ni, Cr, Mo, Ta, Co, Zr, V, Pd, Hf, Pt, and Fe as a main component of the second conductive layer.

4. A semiconductor device comprising:
a plurality of memory cells over a substrate, each comprising an antifuse, wherein the antifuse comprises a first conductive layer, a second conductive layer, and an intermediate layer interposed between the first conductive layer and the second conductive layer, wherein the intermediate layer is a multilayer film in which a semiconductor film and an insulating film are stacked, wherein the semiconductor film is over and in direct contact with the first conductive layer, the insulating film is over and in direct contact with the semiconductor film, and the second conductive layer is over and in direct contact with the insulating film wherein a thickness of the semiconductor film is greater than or equal to 5 nm and less than or equal to 200 nm, wherein a thickness of the insulating film is greater than or equal to 1 nm and less than or equal to 20 nm, and wherein the semiconductor film of the intermediate layer is a single layer.

5. The semiconductor device according to claim 1,
wherein the semiconductor film of the intermediate layer is a single layer or a multilayer film of two or more layers, and
wherein the semiconductor film comprises a semiconductor containing silicon or germanium as a main component of the semiconductor.

6. The semiconductor device according to claim 1,
wherein a semiconductor containing silicon or germanium as a main component of the semiconductor film is any one of amorphous silicon, microcrystalline silicon, polycrystalline silicon, amorphous germanium, microcrystalline germanium, polycrystalline germanium, amorphous $Si_xGe_{1-x}$, ($0<x<1$), microcrystalline $Si_xGe_{1-x}$ ($0<x<1$), and polycrystalline $Si_xGe_{1-x}$ ($0<x<1$).

7. The semiconductor device according to claim 6,
wherein the semiconductor film further comprises an impurity element, and
wherein the impurity element is selected from the group of P, As, and B.

8. A semiconductor device comprising:
a plurality of memory cells over a substrate, each comprising an antifuse, wherein the antifuse comprises a first conductive layer, a second conductive layer, and an intermediate layer interposed between the first conductive layer and the second conductive layer, wherein the intermediate layer is a multilayer film in which a semiconductor film and an insulating film are stacked, wherein the semiconductor film is over and in direct contact with the first conductive layer, the insulating film is over and in direct contact with the semiconductor film, and the second conductive layer is over and in direct contact with the insulating film wherein a thickness of the semiconductor film is greater than or equal to 5 nm and less than or equal to 200 nm, wherein a thickness of the insulating film is greater than or equal to 1 nm and less than or equal to 20 nm, and wherein the insulating film of the intermediate layer is a multilayer film of two or more layers.

9. The semiconductor device according to claim 1,
wherein the insulating film of the intermediate layer is a single film or a multilayer film of two or more layers, and
wherein the insulating film of the intermediate layer contains any one of oxide of silicon, germanium, or $Si_xGe_{1-x}$ ($0<x<1$), nitride of silicon, germanium, or $Si_xGe_{1-x}$ ($0<x<1$), or oxynitride of silicon, germanium, or $Si_xGe_{1-x}$ ($0<x<1$).

10. The semiconductor device according to claim 1,
wherein the second conductive layer comprises Al.

11. The semiconductor device according to claim 1, further comprising a thin film transistor,
wherein a gate electrode of the thin film transistor and the first conductive layer are on a gate insulating film,
wherein an insulating film is over the gate electrode and the first conductive layer, and
wherein the second conductive layer and a wiring connected to a semiconductor layer of the thin film transistor are on the insulating film.

12. The semiconductor device according to claim 11, further comprising an antenna portion and a power supply portion,
wherein an antenna is over the insulating film in the antenna portion and the power supply portion.

* * * * *